(12) United States Patent
Feuillet et al.

(10) Patent No.: US 12,080,824 B2
(45) Date of Patent: Sep. 3, 2024

(54) METHOD FOR PRODUCING AN OPTOELECTRONIC DEVICE COMPRISING MICROLEDS

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Guy Feuillet, Grenoble (FR); François Templier, Grenoble (FR); Jesus Zuniga Perez, Biot (FR); Philippe Vennegues, Antibes (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 442 days.

(21) Appl. No.: 17/645,523

(22) Filed: Dec. 22, 2021

(65) Prior Publication Data
US 2022/0199853 A1 Jun. 23, 2022

(30) Foreign Application Priority Data
Dec. 22, 2020 (FR) ..................................... 20 13978

(51) Int. Cl.
*H01L 33/00* (2010.01)
*H01L 33/16* (2010.01)
*H01L 33/32* (2010.01)

(52) U.S. Cl.
CPC ...... *H01L 33/0075* (2013.01); *H01L 33/0093* (2020.05); *H01L 33/16* (2013.01); *H01L 33/32* (2013.01); *H01L 2933/0066* (2013.01)

(58) Field of Classification Search
None
See application file for complete search history.

(56) References Cited

U.S. PATENT DOCUMENTS

| 10,553,426 B2 | 2/2020 | Feuillet et al. |
| 10,734,439 B2 | 8/2020 | Templier et al. |
| (Continued) | | |

FOREIGN PATENT DOCUMENTS

| EP | 3 624 192 A1 | 3/2020 |
| FR | 3 044 464 A1 | 6/2017 |
| WO | WO 2017/194845 A1 | 11/2017 |

OTHER PUBLICATIONS

"Characterization and growth mechanism of nonpolar and semipolar GaN layers grown on patterned sapphire substrates" by Okata et al. (Year: 2012).*

(Continued)

*Primary Examiner* — Evren Seven
(74) *Attorney, Agent, or Firm* — Oblon, McClelland, Maier & Neustadt, L.L.P.

(57) ABSTRACT

A method for producing an optoelectronic device having nitride-based microLEDs includes providing an assembly having at least one growth substrate and a nitride structure, where the nitride structure has a semipolar nitride layer that includes an active stack and crystallites extending from facets of the growth substrate with a crystalline orientation {111} to the first face of the semipolar nitride layer and providing an integrated control circuit featuring electric connection pads. The assembly is placed on the integrated control circuit, the growth substrate and the crystallites are (Continued)

removed, and trenches are formed in the stack so as to delimit a plurality of islets, each islet being configured to form a microLED.

17 Claims, 12 Drawing Sheets

(56) References Cited

U.S. PATENT DOCUMENTS

| | | | |
|---|---|---|---|
| 11,139,167 B2* | 10/2021 | El Khoury Maroun | ..................... C30B 25/04 |
| 2011/0180781 A1* | 7/2011 | Raring | .................. H01L 27/156 257/E33.025 |
| 2011/0227198 A1* | 9/2011 | Wunderer | ............. C30B 25/186 438/481 |
| 2012/0276722 A1* | 11/2012 | Chyi | ..................... C30B 29/403 257/E21.109 |
| 2015/0325746 A1* | 11/2015 | Percival | .................. H01L 33/20 438/39 |
| 2018/0330941 A1* | 11/2018 | Feuillet | ............... H01L 21/0254 |
| 2019/0131343 A1 | 5/2019 | Templier et al. | |
| 2020/0091224 A1 | 3/2020 | Bono et al. | |

OTHER PUBLICATIONS

"Growth and doping of semipolar GaN grown on patterned sapphire substrates" by Schultz et al. (Year: 2014).*

"Selective-area growth of GaN on non- and semipolar bulk GaN substrates" by Okata et al. (Year: 2014).*

French Preliminary Search Report issued Sep. 23, 2021 in French Application 20 13978 filed on Dec. 22, 2020, 15 pages (with English Translation of Categories of Cited Documents & Written Opinion).

Mantach et al., "Semipolar (10-11) GaN growth on silicon-on-insulator substrates: Defect reduction and meltback etching suppression", Journal of Applied Physics 125, 035703, 2019, 10 pages.

* cited by examiner

DETAIL A

METHOD FOR PRODUCING AN OPTOELECTRONIC DEVICE COMPRISING MICROLEDS

TECHNICAL FIELD

The present invention relates to the field of optoelectronic devices that include LEDs (light-emitting diodes) based on nitride, for example gallium nitride (GaN), as well as an electronic circuit to control said LEDs. The invention is particularly advantageous in its application in the field of optoelectronic devices wherein the LEDs are of micrometric size. The term "microLED" is often used to describe these LEDs. In this field, a particularly advantageous use of the invention relates to the manufacturing of small screens, generally referred to as microdisplays. Another advantageous use relates for example to the manufacturing of projectors.

STATE OF THE ART

MicroLEDs based on nitride, and in particular on gallium nitride (GaN), are very interesting for augmented reality applications, as they enable to produce very compact and very luminous microdisplays. Typically, the luminance is of approximately 1 MCd/m$^2$, which is vastly greater than that afforded by OLED (organic LED) technologies, whose luminance does not exceed several thousands of Cd/m$^2$.

There are optoelectronic devices that include LEDs and an electronic circuit enabling to control individually the LEDs in order to display images.

To create such a device, traditional solutions involve producing separately the control circuit and the plurality of LEDs, and then connecting them to one another to create the display device. This solution is shown in FIGS. 1A to 1C. FIG. 1A shows a stack 1 comprising a substrate 11 supporting the LEDs 12. The control circuit 2 is shown in FIG. 1B. It can comprise a semiconductor substrate 21, for example a silicon substrate. By way of example, the control circuit 21 is created using CMOS technology. On the side of one of its faces, the control circuit 2 comprises a plurality of metallic pads 22. Each pad 22 is intended to be connected to an electrode of a LED 12, to be able to control the LEDs individually.

The stack 1 comprising the LEDs 12 and the control circuit 2 is coupled by placement as shown in FIG. 1C, thus leading to a hybrid structure. This technique therefore involves placing these two structures 1, 2, thereby imposing strong constraints in terms of the alignment of the LEDs 12 and the metallic pads 22. The support substrate 11 carrying the LEDs 12 can then be removed.

Thus, a disadvantage of this manufacturing technique resides in having to accurately align the control circuit and the stack comprising the LEDs during the step of assembling these two elements, so that each LED is properly positioned on its corresponding metallic pad in the control circuit. This alignment is particularly difficult to achieve when the pitch of the pixels decreases and hampers the increase of the resolution and/or the integrated density of the pixels. In practice, with this solution, the pitch of the pixels cannot be less than 5 micrometres.

Document WO2017194845, also published under number US2019131343, describes a method for producing LEDs.

Using known solutions, in practice, the electrooptic performance achieved by the µ-LEDs is often unsatisfactory, in particular in terms of radiative efficiency of luminescence.

There is therefore a significant need to alleviate the disadvantages of known solutions to obtain an optoelectronic device comprising nitride-based microLEDs. In particular, it would be particularly advantageous to offer a solution to produce such an optoelectronic device wherein the pitch of the pixels is reduced and/or wherein the pixels feature improved electrooptical performances.

SUMMARY

To achieve this goal, one embodiment involves a method for producing an optoelectronic device comprising nitride-based microLEDs (light-emitting diodes), said method comprising the following steps:

a. providing an assembly comprising at least:
   a growth substrate including at least one crystalline layer, the crystalline layer comprising a plurality of parallel grooves, each groove comprising at least two angled facets arranged opposite one another, each forming a continuous strip, at least one of said two opposite facets featuring a crystalline orientation {111};
   a nitride structure made at least partially of nitride (N) obtained from at least one element among gallium (Ga), indium (In), and aluminium (Al), the nitride structure comprising:
      a semipolar layer of nitride, featuring a first face turned towards the crystalline layer, the semipolar nitride layer including a stack comprising at least the first and second semiconducting layers doped for opposite conductivity types,
      crystallites extending from said facets featuring a crystalline orientation {111} to the first face of the semipolar nitride layer,
b. providing an integrated control circuit featuring a front face that includes or is electrically connected to a plurality of electric connection pads,
c. placing the assembly on the front face of the control circuit, so that the second layer of the stack is electrically connected to the electric connection pads of the control circuit,
d. removing the growth substrate by separating the crystallites from the facets featuring a crystalline orientation {111},
e. removing the crystallites,
f. forming trenches in the stack so as to delimit a plurality of islets, each intended to form a microLED and each connected to at least one electric connection pad of the control circuit.

Thus, the method enables to produce microLEDs, of very small size and formed in a semipolar nitride layer of nitride featuring few dislocations. This enables to produce screens with a very small pitch and with substantially improved electrooptic performances.

Indeed, the assembly supporting the semipolar nitride layer, for example a SOI substrate, enables to reduce the dislocations in this layer, in particular at the grain boundaries. Furthermore, the proposed method is advantageous in that, during the step of placing the nitride layer on the control circuit, the positions of the different LEDs of the device are not yet defined. There is therefore no strong constraint in terms of alignment precision during the placing. The delimitation of the different LEDs in the active stack can then be obtained by traditional structuration methods that offer an alignment precision substantially greater than the precision that is obtained by placing a substrate on another.

Furthermore, the method is particularly reliable and inexpensive.

Furthermore, it enables to produce microLEDs of different colours. In particular, the use of materials in a semipolar orientation enables to integrate more indium in the nitride layer. It is then possible to obtain LEDs emitting in the green to red wavelengths and that offer improved quality compared with other known solutions, in particular in terms of performance. Furthermore, it is possible to produce LEDs that emit in the red wavelength.

BRIEF DESCRIPTION OF THE FIGURES

The purposes, objects, characteristics, and advantages of the invention will be made clearer upon reading the detailed description of one of its embodiments, which is illustrated by the following accompanying figures, wherein:

FIG. 2A shows, in a simplified manner, an assembly comprising a growth substrate supporting a structure that includes a semipolar nitride layer.

FIG. 2B shows an expanded view of the portion A of the assembly in FIG. 2A.

FIG. 2C shows an expanded view of the portion B of the nitride layer in FIG. 2A to illustrate the doping performed in this semipolar nitride layer to form layers of opposed polarity. This figure also shows the stacks of layers that form, in this non-limiting example, quantum wells.

FIG. 2D schematically shows a control circuit.

FIG. 2E shows a step of placing the assembly on the control circuit.

FIG. 2F shows a step of removing the growth substrate by separating the latter from the nitride structure, in a non-limiting example of solely mechanical separation.

FIG. 2G shows a stack obtained following the step of removal of the growth substrate.

FIG. 2H shows a step of planarisation to remove the crystallites and to leave the nitride layer in place.

FIG. 2I shows a step of forming trenches inside the nitride layer to delimit microLEDs opposite each electric connection pad of the control circuit.

FIG. 3A shows in a schematic manner an example of assembly that can be, for instance, the one shown in FIG. 2A and comprising a semipolar nitride layer formed by epitaxy from the crystalline facets supported by a growth substrate.

Figure 1A:
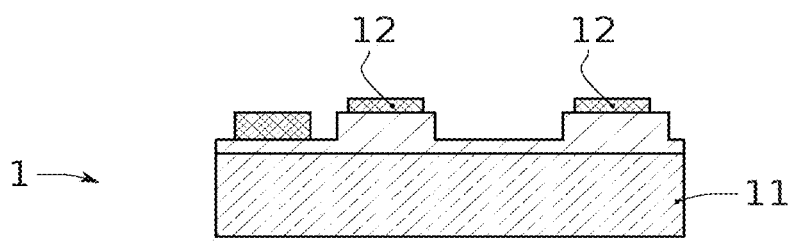
FIGS. 1A to 1C show, in a highly schematic manner, an example of a known solution to produce an optoelectronic device by placing a stack comprising an assembly of LEDs on a control circuit.

These figures are provided by way of non-limiting examples of the invention. They are schematic representations of the principle intended to facilitate understanding of the invention and are not necessarily at the scale of practical applications. In particular, the thickness of the different layers or the size of the crystallites are not representative of reality.

DETAILED DESCRIPTION

Before beginning a detailed review of the embodiments of the invention, optional characteristics that can be used in association or as an alternative are listed hereunder:

According to one example, said facets that feature a crystalline orientation {111} have a width F132 and the grooves are arranged periodically with a period P, the ratio P/F132 being such that P/F132≥3, preferably P/F132≥5, and preferably P/F132≥10. According to one example, the width F132 is measured from one summit of the grooves to one bottom of the grooves, following a direction perpendicular to the main extension direction of the grooves.

This ratio ensures that the adherence of the semipolar structure is sufficient to enable a controlled execution of the method, in particular during the epitaxial growth, while facilitating the separation of this semipolar structure from its growth substrate.

According to one example, F132 is measured along a direction shared by the plane of the oriented facets <111> and by a plane perpendicular to the main plane wherein extends the second face of the semipolar nitride layer opposite the first face.

According to one example, the step d) of removing the growth substrate comprises the application of a mechanical action on at least one among the growth substrate and the semipolar nitride structure. According to one example, the application of a mechanical action preferably comprises the initiation of a fracture from an edge of one among the growth substrate and the semipolar nitride structure, using blunt object.

According to one example, the semipolar nitride layer comprises alternating first zones and second zones forming strips or lines that are parallel with the grooves, the first zones having first dislocation densities D51 and the second zones having second dislocation densities D52, whereby D51>K1*D52, with K1>10, preferably K1>100.

According to one example, D51 corresponds to a minimum density, and D52 corresponds to a maximum density.

According to one example, the second zones are arranged periodically in the semipolar nitride layer, for example on the second face opposite the first face, following a period P51, and the electric connection pads are arranged so that the majority and preferably all the second zones are respectively located opposite a single electric connection pad.

According to one example, the distribution of the first zones is configured so that the first zones are removed by the step f) of forming the trenches.

Thus, the LEDs do not comprise the zones with high densities of defects. On the contrary, the LEDs are formed in the zones with low or non-existent defect densities. The quality of the optoelectronic device is thereby further improved.

According to one example, the epitaxy is a metalorganic vapour phase epitaxy (MOPVE). Nonetheless, it is perfectly possible to consider other epitaxy techniques for the purpose of the present invention.

According to one example, the electric connection pads are separated from one another by electrically insulating regions, the first zones being arranged opposite the electrically insulating regions.

According to one example, the electric connection pads are distributed periodically following a period P220. According to one example, P51=X*P220, with X ranging from 0.8 to 1.2, and where X preferably ranges from 0.9 to 1.1, and X preferably ranges from 0.95 to 1.05. Thus, preferably, the pitch P220 of the electric connection pads and the pitch P51 of the second zones are identical. This enables to achieve an accurate connection of each of the LEDs to the pads, while also reducing the positioning constraints of the assembly on the control circuit.

According to one example, the step e) of removal of the crystallites comprises a step of chemical mechanical polishing (CMP). This step is simplified as the polishing can be halted by the detection of the zone without crystallites, which serves as the detection of the end of the operation. Furthermore, in certain cases, the CMP step triggers the mechanical detachment.

According to one example, the first face is substantially flat.

According to one example, the method further includes, following the step f) of forming the trenches, a step of deposition, on each LED, of an electrode on and in contact with the first face of the semipolar nitride layer.

According to one example, the crystalline layer is a silicon-based layer, and the growth substrate is a substrate of the semiconductor on insulator (SOI) type, or a substrate of the silicon on sapphire (SOS) type.

According to one example, the supply of the assembly comprises the supply of the growth substrate and a step of epitaxial growth of the semipolar nitride structure from said facets featuring a crystalline orientation {111}.

According to one example, the growth substrate comprises a barrier layer whereon the crystalline layer rests while being directly in contact therewith, the barrier layer being configured to allow the epitaxial growth of the semipolar nitride layer from the crystalline layer without epitaxial growth from the barrier layer.

According to one example, the crystalline layer is silicon-based or made of silicon and the facets are formed by or covered by a crystalline buffer layer, the crystalline buffer layer being preferably made of AlN.

According to one example, the step of epitaxial growth comprises: a first epitaxial growth of a material based on aluminium nitride (AlN) from said facets featuring a crystalline orientation {111}; then at least a second epitaxial growth of a material based on gallium nitride (GaN) from said material based on aluminium nitride (AlN).

Advantageously, the grooves extend along a first direction that corresponds to a direction shared by the plane of said upper surface and by the plane <111>.

According to one example, the step e) of removing the crystallites is performed first, followed by the step f) of forming the trenches.

The term "microLED" is used to describe a LED with at least one dimension taken in a plane parallel with the main plane wherein extends the substrate supporting the microLED (i.e., the xy plane of the orthogonal coordinates referenced in the figures) that is micrometric, i.e., strictly less than 1 mm ($10^{-3}$ metres), and preferably ranging from 0.2 to 100 µm ($10^{-6}$ metres). For the purpose of the invention, the microLEDs have, in projection in a main extension plane parallel with the main faces of the microLEDs, i.e., parallel with an upper face of the substrate, maximum dimensions of micrometric size in the plane. Preferably, these maximum dimensions are smaller than a few hundreds of micrometres. Preferably, these maximum dimensions are smaller than 500 µm.

In the rest of the description, the terms crystals and crystallites are considered as equivalent.

It should be specified that, for the purpose of the present invention, the terms "on", "is on top of", "covers", or "underlying" or their equivalents do not mean "in contact with". Thus, for example, "the deposition of a first layer on a second layer" does not necessarily mean that both layers are directly in contact with one another but means that the first layer covers at least partially the second layer by being either directly in contact therewith, or by being separated therefrom by at least one other layer or at least one other element, including air.

The steps to form the different layers and regions should be understood in their broadest sense: they can be performed as a sequence of sub-steps that are not necessarily successive.

The terms "substantially", "approximately", and "in the order of" mean "in the 10% range, preferably in the 5% range".

Several embodiments of the invention implementing the successive steps of the manufacturing method are described below. Unless explicitly mentioned, the adjective "successive" does not necessarily imply that the steps are performed in immediate succession, as there can be intermediary steps separating them, even if the above meaning is generally preferred.

Furthermore, the term "step" is taken to mean the completion of a part of the method and can be used to describe several sub-steps.

Furthermore, the term "step" does not necessarily mean that the actions performed during a step are performed simultaneously or in immediate succession. In particular, some actions of a first step can be followed by actions associated with a different step, and other actions of the first step can later be resumed. Thus, the term step is not necessarily to be understood as describing actions that are unitary or inseparable in time and in the sequence of phases of the method.

The terms "insulating", or "dielectric", are used to describe a material whose electric conductivity is sufficiently low in the given application for it to serve as insulator. In the present invention, a dielectric material preferably has a dielectric constant of less than 7. Typically, spacers are formed of a dielectric material.

For the purpose of the present invention, the term resin is used to describe an organic or an organo-mineral material that can be shaped by an exposure to a beam of electrons, photons, or X-rays, or that can be shaped mechanically. Examples include the resins traditionally employed in microelectronics, resins based on polystyrene (PS), on methacrylate (for example Poly(methyl methacrylate) or PMMA), on hydrogen silsesquioxane (HSQ), on poly(hydroxystyrene) (PHS), etc. The advantage of using a resin is that it is easy to deposit a substantial thickness of it, measuring from several hundreds of nanometres to several microns.

The term optoelectronic device is used to describe any type of device produced by microelectronic means and having at least one optical function. It can also be an intermediary product solely intended to produce another optoelectronic device.

Materials

The term substrate, layer, or device "based" on a material M is used to describe a substrate, a layer, or a device that comprises only said material M, or said material M with possibly other materials, for example alloy elements, impurities, or dopants.

Thus, a "layer based on nitride" can be a layer made only of nitride, or a layer made of nitride combined with other materials or dopants.

For example, a layer or a structure of nitride made at least partially of nitride (N) obtained from at least one element among gallium (Ga), indium (In), and aluminium (Al), can be a layer or a structure based on GaN, InN, AlN, InGaN, AlGaN, AlInN.

Thickness and Orientation of the Figures

It is specified, for the purpose of the present invention, that the thickness of a layer or a substrate is measured along a direction perpendicular to the surface along which said layer or said substrate has its maximum extension. In the figures, the thickness of horizontal layers is measured vertically.

When it is mentioned that an element is arranged opposite another element, it means that both elements are arranged on a same line perpendicular to the main plane of the substrate, or on a same line oriented vertically in the figures.

In the following description, and unless otherwise mentioned, when absolute position qualifiers are used, such as the terms "front", "rear", "top", "bottom", "left", "right" etc., or when relative position qualifiers are used, such as "above", "beneath", "upper", "lower", etc., or when orientation qualifiers are used, such as the terms "horizontal", "vertical", "lateral", etc., reference is made to the corresponding figures, it being understood that in practice, the described devices and assemblies can be oriented differently.

Doping

In the present invention, doping types are specified. These doping types are non-limiting examples. The invention covers all the embodiments wherein doping types are inverted. Thus, if an embodiment example mentions for a first zone a doping P and for a second zone a doping N, the present description then describes, implicitly at least, the opposite example wherein the first zone has a doping N and the second zone has a doping P.

Conventionally, a doping noted P+ means that it is a doping of type P (doping through positive charges), of which the content of dopant species is greater than or equal to 1 atom of the dopant species for at least 1000 atoms of the semiconductor, and preferably for less than 10 to 100 atoms of the material forming the semiconductor layer. Similarly, a doping noted N+ means that it is a doping of type N (doping through negative charges), of which the content of dopant species is greater than or equal to 1 atom of the dopant species for at least 1000 atoms of the semiconductor, and preferably for less than 10 to 100 atoms of the material forming the semiconductor layer.

In the present patent application, a doping noted P includes all the doping types by positive charge carriers, regardless of the doping content. Thus, a doping P comprises the content in doping P+ and the content in doping P less than the doping of type P+. Similarly, a doping noted N includes all the doping types by negative charge carriers, regardless of the doping content. Thus, a doping N comprises the content in doping N+ and the content in doping N less than the doping of type N+.

With reference to FIGS. 2A to 2I, an example of a method to produce an optoelectronic device according to the invention is described below. These steps are described briefly and are explained in greater detail below, with reference to the other figures.

Figure 2A:
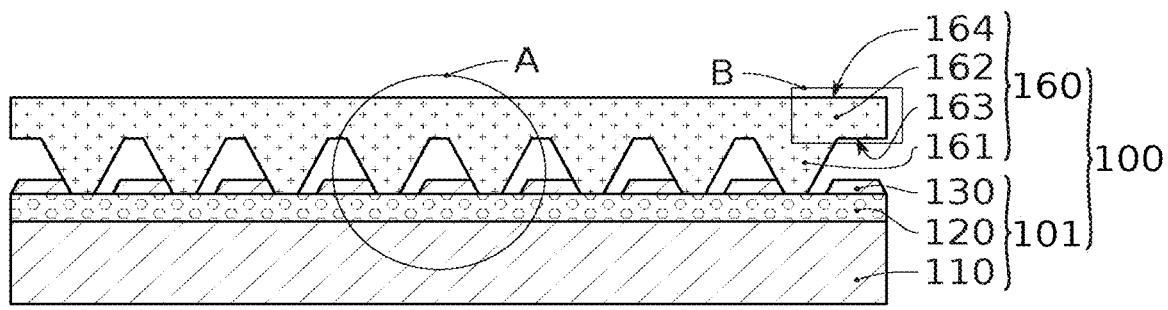
FIGS. 2A to 2I show the steps of an example of a method to produce an optoelectronic device according to the invention.
Figure 2B:
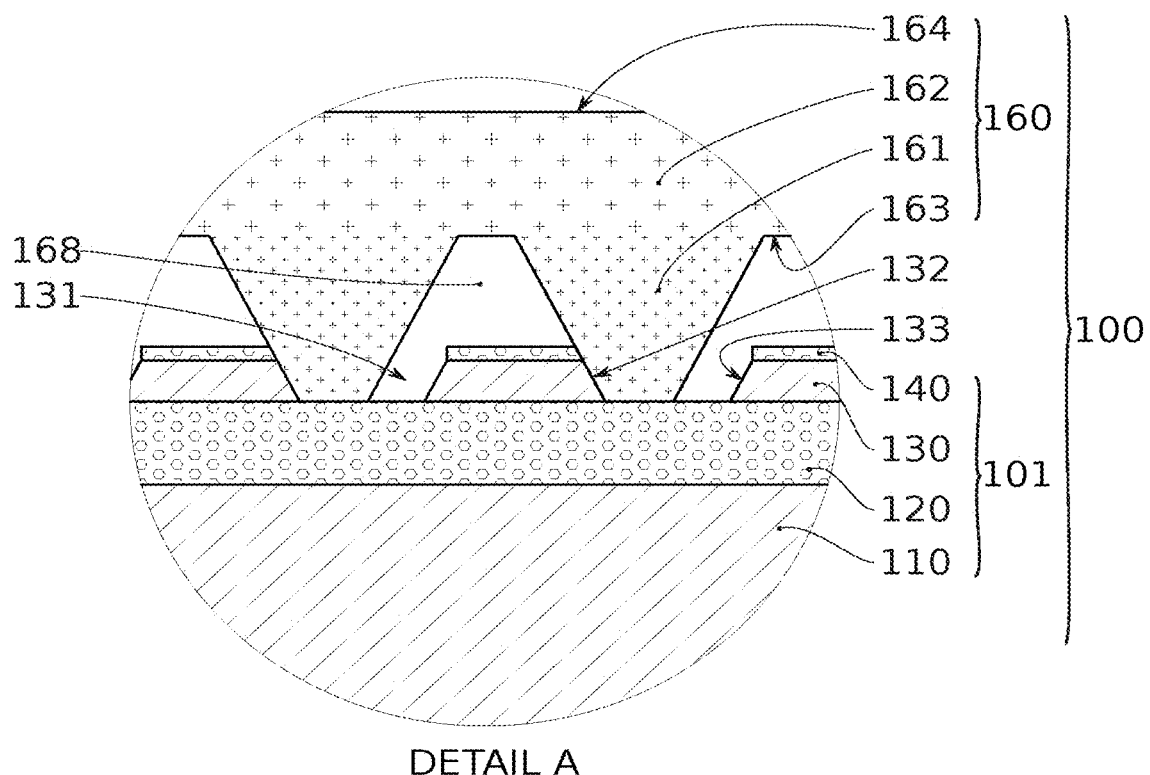

FIG. 2A shows, in a simplified manner, an assembly 100 comprising a growth substrate 101 supporting a structure 160 that includes a semipolar nitride layer 162. FIG. 2B shows an expanded view of the zone A of said assembly 100.

In greater detail, the growth substrate 101 has a crystalline layer 130 comprising a plurality of parallel grooves 131 or trenches. They are preferably arranged in the form of a network, preferably periodic in nature. Each groove 131 defines at least two angled facets 132, 133, opposite each other, each forming a strip. These strips are continuous or interrupted in their length. At least one 132 among the two opposite facets 132, 133 features a crystalline orientation {111}. Thus, the crystalline layer 130 is chosen so as to feature, after engraving, facets with an orientation {111}.

In the example shown in FIG. 2A, the growth substrate 101 features a structure of the semiconductor on insulator type. In these structures, the crystalline layer 130 is on top of the barrier layer 120 (an insulating layer in this example) supported by a support substrate 110. For example, the growth substrate 101 is a SOI-type substrate (silicon on insulator). In an alternative embodiment, the growth substrate 101 is of the SOS-type (silicon on sapphire). In this case, the crystalline layer 130 is a silicon-based layer on top of a sapphire layer, separated therefrom by a dielectric layer, usually made of SiO2. Alternatively, the growth substrate 101 can be a bulk substrate.

In both these embodiments, these substrates are advantageous in that the crystalline layer 130 features a reduced thickness. Thus, the epitaxial growth is achieved from a very small surface, thereby reducing the dislocations in the epitaxially grown layer. The performance of the device produced from the nitride layer is therefore improved.

The crystalline layer 130 features an upper face which, in this example, is covered by a mask 140 that was used, during a previous step that is not shown, to open the grooves 131 in the crystalline layer 130. The mask 140 is for example produced by deposition or growth of a layer of silicon dioxide (SiO2) or silicon nitride (SiN). Optionally, as shown in FIGS. 4E to 4G, it should be noted that this growth substrate 101 can also comprise a second mask 147 shaped to mask the facets 133 of the crystalline layer 130 that are opposite the facets 132 that feature the crystalline orientation {111}.

An example of a method to produce a growth substrate 101 is described in further detail with reference to FIGS. 4A to 4G.

The nitride-based structure 160 has crystallites 161 that extend from the crystalline layer 130 to the semipolar nitride layer 162.

More specifically, these crystallites 161 were developed by epitaxial growth from the facets 132 featuring the crystalline orientation {111}. The adjacent crystallites then coalesced to form the continuous semipolar nitride layer 162.

The advantages of this technique to grow the semipolar nitride layer 162 are described in detail below. Furthermore, an example of the method to produce the structure 160 that includes the semipolar nitride layer 162 is described in further detail with reference to FIGS. 4A to 4G.

At this point, it should be noted that the surface of contact between the nitride-based structure 160 and the growth substrate 101 is limited to the surface of contact between the crystallites 161 and the facets 132 with the crystalline orientation {111}. This surface of contact is reduced with respect to the semipolar nitride layer 162 and, in particular, at the surface of its lower face 163 turned towards the growth substrate 101. Thus, the surface of the growth substrate 101 that maintains the semipolar layer 162, typically a vignette also referred to as a platelet, is very small in front of the surface of this semipolar layer. As is described in further detail below, these small facets 132 enable to reduce the surface wherefrom the epitaxial growth is initiated, and thus to limit the number of dislocations that are generated and spread to the surface of the epitaxially grown semipolar layer 162.

In the rest of the description, the lower face 163 is referred to as first face. It should also be noted that a vacuum is present in the space 168 between the first face 163 of the semipolar nitride layer 162 and the growth substrate 101.

The semipolar nitride layer 162 is made at least partially of a nitride (N) obtained from at least one element among gallium (Ga), indium (In), and aluminium (Al). According to one example, it is based on gallium nitride (GaN) or made of GaN.

Figure 2C:
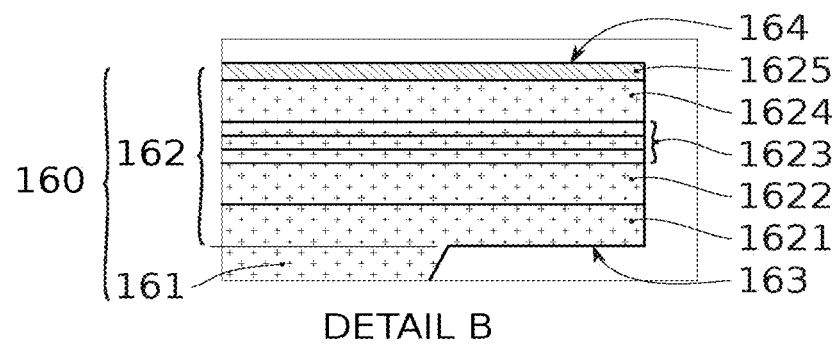

FIG. 2C shows an expanded view of the zone B of the semipolar nitride layer 162 to illustrate the doping performed within this layer to form layers of opposed polarity. This figure also shows the stacks of layers that form, in this example, quantum wells.

The semipolar nitride layer 162 comprises a stack of several layers, preferably an active stack to form LEDs. In the shown example, the active stack comprises, in order starting from the first face 163 of the semipolar nitride layer 162:
  a. a buffer nitride layer 1621. This stack can also not comprise the buffer layer 1621.
  b. a layer 1622 of nitride doped by a first doping type chosen among N-doping or P-doping,
  c. an emissive layer 1623,
  d. a nitride layer 1624 doped with inverse type of doping with respect to the doping of layer 1622. Typically, the nitride layer 1622 is N-doped and the nitride layer 1623 is P-doped.

The stack is referred to as 1622-1624 in the rest of this description. It can comprise other layers than the layers 1622 to 1624. For example, it can comprise the optional buffer layer 1621 and/or an optional layer of electrical contact 1625, as described below.

For example, the emissive layer 1623 comprises or is made of a stack of one or several emissive layers, each forming a quantum well, for example based on GaN, InN, InGaN, AlGaN, AlN, AlInGaN, GaP, AlGaP, AlInGaP, or a combination of one or several among these materials. As an alternative, the emissive layer 1623 can be an intrinsic layer of gallium nitride, i.e., not intentionally doped, for example with a concentration of residual donors ranging from 1015 to 1018 atoms/cm3, for example in the range of 1017 atoms/cm3. In this example, the lower face of the emissive layer 1623 is in contact with the upper face of the layer 1622, and the upper face of the emissive layer 1623 is in contact with the lower face of the layer 1624.

Figure 2D:
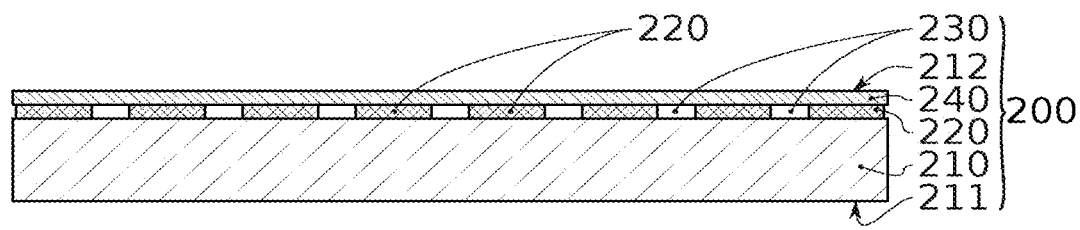

FIG. 2D schematically shows a control circuit 200, preferably an integrated circuit. The control circuit 200 is formed in and on a semiconductor substrate 210, for example a silicon substrate. In this example, the control circuit 200 comprises, on the side of its front face 212, for each of the LEDs of the device, a connection pad 220 intended to be electrically connected to the LED, typically by means of one among the electrodes (anode or cathode) of said LED, so as to control a current circulating in the LED and/or to apply voltage to the terminals of the LED. Preferably, the connection pads 220 are metallic pads.

For example, the control circuit comprises, for each LED connected to a connection pad 220, an elementary control cell that has one or several transistors, enabling to control the current circulating in the LED and/or the voltage applied at the terminals of the LED. The control circuit 200 is for example produced by means of CMOS technology. The connection pads 220 can be laterally surrounded by a region 230 made of a dielectric material, for example silicon oxide, so that the control circuit 200 features a substantially flat front face 212 consisting of alternating electrically conducting regions and electrically insulating regions. The contact on the electrodes of the LEDs (cathodes or anodes) that are not connected to the connection pads 220 can be taken collectively, for example in a peripheral region of the control circuit 200, by means of one or several connection pads (not shown in the figure) of the control circuit 200.

Figure 2E:
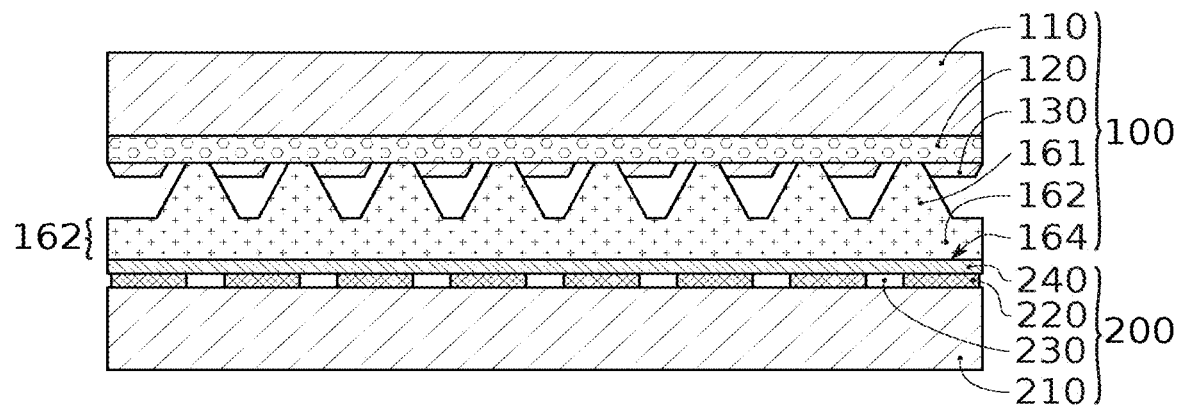

FIG. 2E shows a step during which the assembly 100 including the semipolar nitride layer 162 is placed on the control circuit 200. More specifically, the upper face 164 of the semipolar nitride layer 160, also referred to as second face, is placed on the front face 212 of the control circuit 200. For this purpose, the assembly 100 can be turned over, then placed on the control circuit 200, so as to bring the second face 164 of the assembly 100 in contact with the front face 212 of the control circuit 200. During this step, the active stack 1622-1624 of the semipolar nitride layer 160 is bonded to the control circuit 200.

By way of example, the bonding of the nitride layer 162 that comprises the active stack 1622-1624 to the control circuit 200 can be achieved by direct molecular bonding of the two surfaces brought into contact. As an alternative, the bonding of both surfaces can be achieved by thermocompression, eutectic bonding, or any other adapted bonding method.

In an optional but preferred manner, to facilitate the bonding and to enable good electric conductivity between the nitride layer 162 and the connection pads 220, on at least one of the faces 164, 212 intended to come into contact, an electrically conducting layer is formed.

Preferably, before the placement step, the following should be performed:
  a. deposition of at least one conducting layer 1625 on the active stack 1622-1624 of LEDs. This conducting layer 1625 thus forms the second face 164 of the semipolar nitride layer 162. This conducting layer 1625 is shown in FIG. 2C. This layer 1625 is not shown in FIGS. 2E to 2I for reasons of figure clarity, and also because this layer 1625 is optional. Preferably, this layer covers for example the entire surface of the active stack 1622-1624. Preferably, to ensure a good ohmic contact, a layer of aluminium (Al) or if ITO (indium tin oxide) is deposited. In an alternative or complementary manner, a metallic layer, for example of titanium (Ti), can be deposited to ensure a proper contact. According to one example, the assembly is then annealed.
  b. deposition on the front face 212 of the control circuit 200 of a layer intended to ensure a proper bonding and a proper electrical conduction. Preferably, this layer is metallic. It is referred to as 240. Preferably, the metallic layer substantially covers the entire front surface 212 of the control circuit 200. In particular, the metallic layer is in contact with the connection pads 220. This layer 240 is on top of the connection pads 220 and the insulating regions 230. The upper face of this layer 240 then forms the front face 212 of the control circuit 200.

Figure 2F:
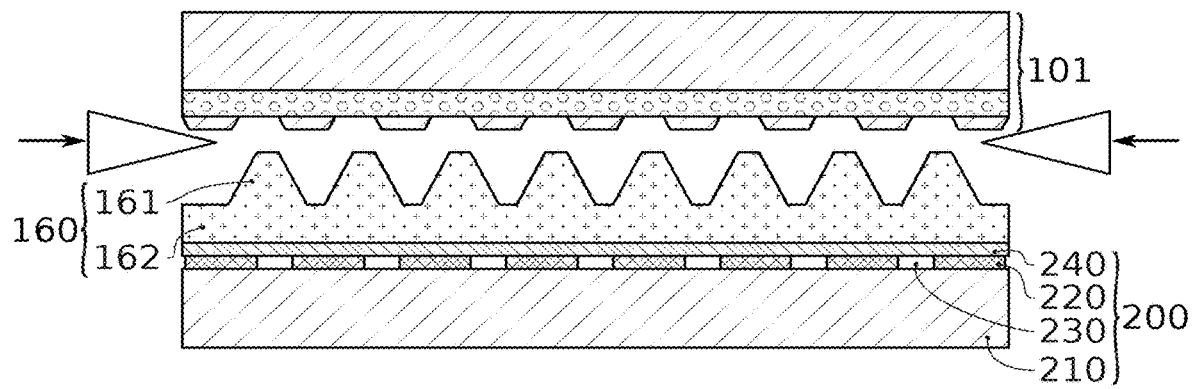

FIG. 2F shows a step performed subsequently to the placement step in FIG. 2E, during which the growth substrate 101 of the assembly 100 is removed so as to leave the semipolar nitride structure 160 that includes the crystallites 161 and the semipolar nitride layer 162 on the control circuit 200.

Preferably, the removal of the growth substrate 101 is obtained by applying a mechanical action. For example, it is possible to apply an action that generates a shear stress between the growth substrate 101 and the semipolar nitride layer 160. As mentioned earlier in reference to FIGS. 2A and 2B, the contact surface between the growth substrate 101 and the semipolar nitride structure 160 is reduced, as it is limited to the surface of contact between the crystallites 161 and the facets 132 featuring the crystalline orientation {111}. This separation is therefore performed in a perfectly controlled manner. This method therefore offers a particularly efficient solution to place, in an inexpensive and reproducible way, a semipolar nitride layer on a control circuit.

For example, the fracture can be initiated from one of the edges of the wafer forming the assembly 100, using a blunt tool for example. There are many methods that can be used to initiate or to fully perform this fracture. For example, shearing tools can be used. Ultrasounds can also be used.

Figure 2G:
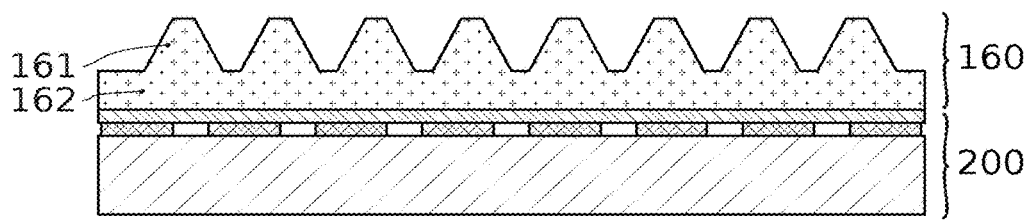

FIG. 2G shows the stack obtained following the step of removing the growth substrate 101.

Figure 2H:
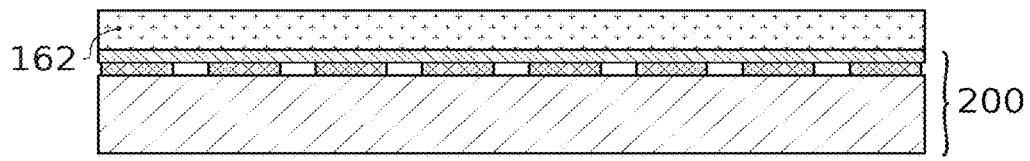

FIG. 2H shows the result obtained after a step of removing the crystallites 161. This step leaves the semipolar nitride layer 162 in place. Preferably, this step comprises a planarisation sub-step, for example by chemical mechanical polishing (CMP). The removal of the crystallites 161 can also be performed by chemical means. For this purpose, traditional silicon etchings can be used, for example based on a potassium hydroxide (KOH) solution.

Figure 2I:
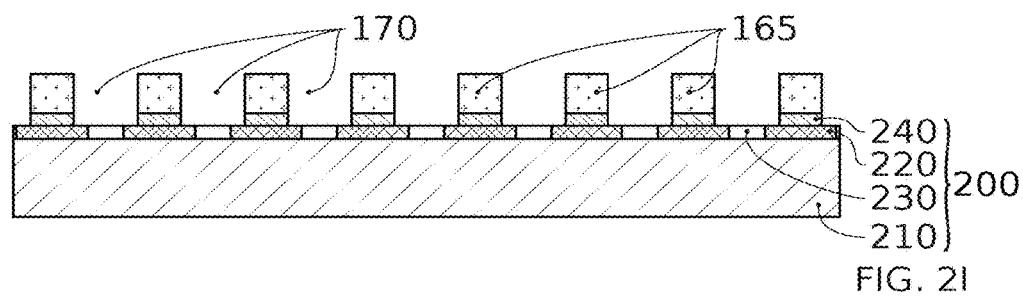

FIG. 2I shows a step of forming the trenches 170 inside the semipolar nitride layer 162 to delimit islets 165 or mesas, each forming or intended to form a microLED. In the rest of the description, the reference 165 is used both to describe a LED and to describe an islet forming or intended to form a LED. Preferably, the trenches form two networks that intersect, preferably at a 90° angle, to define the islets. Thus, in this example, an islet is defined between four trenches that run parallel in pairs. Each LED or islet formed in the stack 1622-1624 is laterally surrounded by a trench 170. These trenches 170 are for example formed by etching from the second face 164 of the semipolar nitride layer 162.

Each islet 165 is arranged opposite an electric connection pad 220 of the control circuit 200. These islets 165 are for example formed by lithography and etching, which offers, using traditional microelectronics techniques, a very high positioning accuracy.

Furthermore, it is possible to produce a device on substrates with large dimensions. The assembly 100 and the control circuit 200 can be respectively formed on wafers with large dimensions. These wafers can, for example, have a diameter of 200 and even 300 millimetres. They have the traditional size of wafers usually used for CMOS technologies.

Figure 1B:
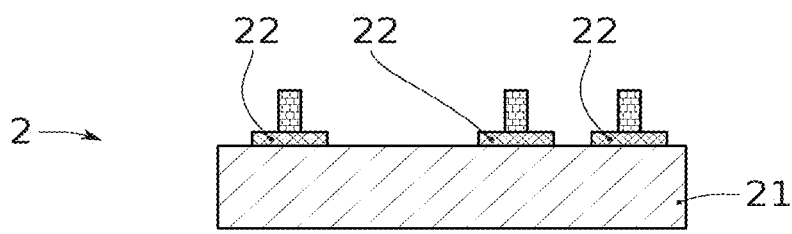
Figure 1C:
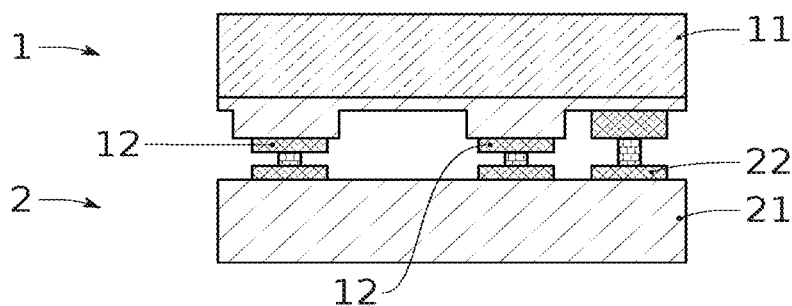

Furthermore, the above description makes it clear that the separation of the growth substrate from the semipolar nitride layer is obtained in a simple and perfectly controlled manner. In traditional solutions, for example the one shown in FIGS. 1A to 1C, the removal of a silicon support substrate requires a step of grinding, which is long and generates significant material losses. Furthermore, the proposed method enables to detect very easily at which moment the grinding step should be halted. Furthermore, the removal of a support substrate in sapphire requires a detachment step of the lift-off type, which significantly increases manufacturing costs.

With known solutions, the semipolar nitride layers used to form the LEDs feature performance levels (in terms of radiative efficiency of luminescence for example) that are much lower in the blue wavelength range. In the green wavelength range, these performance levels are usually much lower. In the red wavelength range, traditional methods do not enable to achieve acceptable performance levels. On the contrary, the semipolar nitride layer forming the microLED of the optoelectronic device obtained using the method according to the invention features very few defects, and in particular, very few dislocations at the coalescence boundaries between crystallites. These coalescence boundaries correspond to the zones 51 referenced in FIG. 7A, which is described in further detail below.

Thus, the above method has the advantage of enabling to obtain very small microLEDs formed from a semipolar nitride layer featuring a very high quality. The screen obtained thereby features a reduced pixel pitch. Furthermore, the microLEDs are able to emit in red and green wavelengths with improved quality.

FIGS. 3A to 3F show a more detailed example of a method to produce optoelectronic devices from the assembly of the control circuit 200 and the semipolar nitride layer 162.

Figure 3A:
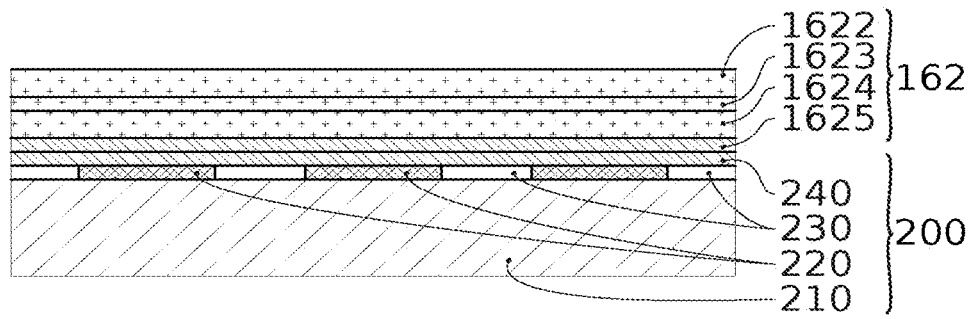
FIGS. 3A to 3F show an example of a method to produce LEDs from an initial structure comprising a nitride layer placed on a control circuit, said initial structure being for example obtained by implementing the steps shown in FIGS. 2A to 2H.

As shown in FIG. 3A, the first step of this method consists in producing an assembly shown in FIG. 2H and comprising the semipolar nitride layer 162 placed on the control circuit 200. Thus, in this figure, the following layers are featured, stacked from the front face of the control circuit 100, this face being typically formed by the face of the metallic layer 240: the metallic layer 1625, the nitride layer 1624 doped with a first doping (typically a doping of type P), the emissive layer 1623 comprising the multiple quantum wells, and the nitride layer 1622 doped with a second doping (typically a doping of type N).

It should be noted in this figure that the stack 1622-1624 does not show the buffer nitride layer 1621. This buffer layer 1621 may indeed have been removed during the removal of the crystallites 161 or during a step that is subsequent to said removal. To remove this buffer layer 1621, plasma etching can be used. The etching process can be halted when it is detected that the layer 1622 (N-doped for example) is laid bare.

Figure 3B:
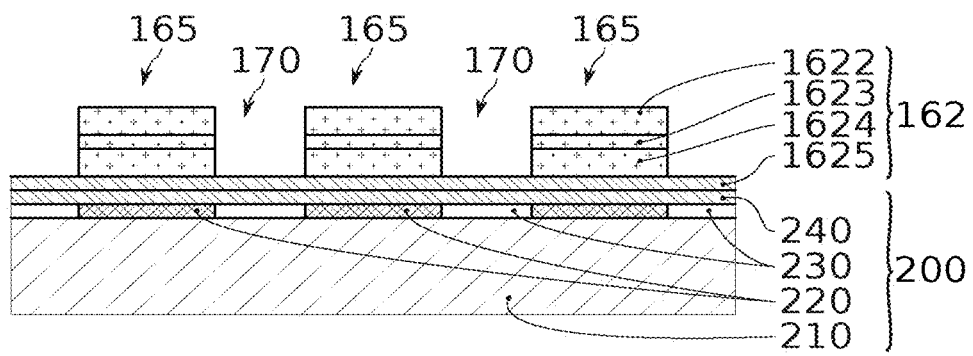

FIG. 3B shows the step of etching the trenches 170 in the active stack 1622-1624, from its upper face 166, for example by lithography and then etching, so as to delimit the plurality of LEDs 165.

Each LED 165 corresponds to an islet formed in the stack 162 and laterally surrounded by a trench 170. The islet can feature a circular circumference, or a circumference of any other shape, for example polygonal (square or rectangle for example). The trenches 170 extend vertically over the full height of the stack 162. Thus, each LED 165 comprises a vertical stack that includes, in order starting from the upper face of the metallic layer 1625, a portion of the nitride layer 1624, corresponding to the anode of the LED in this example, a portion of the emissive layer 1623, and a portion of the nitride layer 1622, corresponding to the cathode of the LED in this example. The trenches 170 can be aligned on markers formed beforehand on the control circuit 200. In the non-limiting example shown, each LED 165 is arranged, in vertical projection, opposite a single connection pad 220 of the control circuit 200. In this example, the trenches 170 are arranged, in vertical projection, opposite the insulating regions 230 of the upper face of the control circuit 200. In the example shown, the metallic layer 240 serves as a barrier layer of the etching when forming the trenches 170 in the active stack 1622-1624.

Figure 3C:
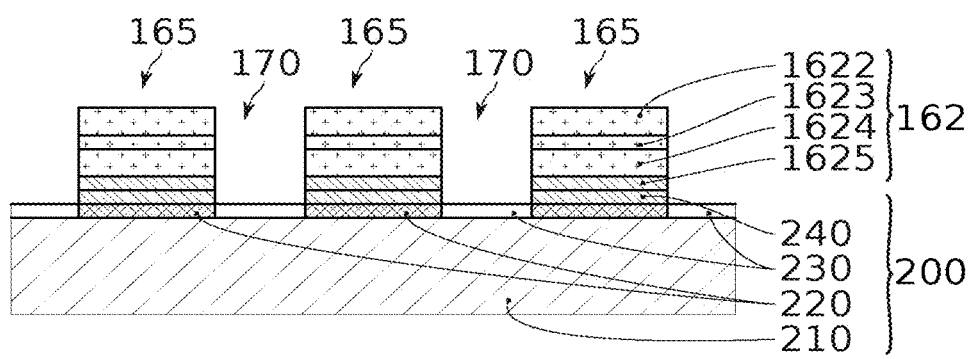

FIG. 3C shows a subsequent step of removing, for example by etching, the portions of the metallic layers 1625 and 240 located at the bottom of the trenches 170, so as to extend the trenches 170 to the insulating regions 230 of the upper face of the control circuit 200. At the end of this step, the anodes (regions 1625) of the different LEDs 165 are electrically insulated from one another by the trenches 170, and each LED 165 has its anode connected to the underlying metallic pad 220 by means of the portions of metallic layers 1625 and 240 remaining between the LED and the pad 220. This enables an individual control of each one of the LEDs by the control circuit 200.

Figure 3D:
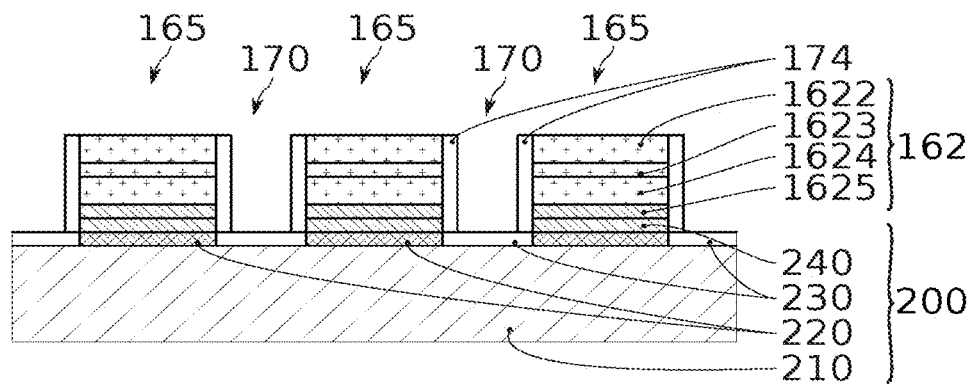

The FIG. 3D shows a subsequent step of depositing, on the sides of the LEDs 165, an insulating passivation layer 174, for example made of silicon oxide. For example, the layer 174 is deposited on the entire upper surface of the assembly using a conformal coating method, then removed only from the upper face of the LEDs 165 and from the bottom of the trenches 170, for example by anisotropic etching.

Figure 3E:
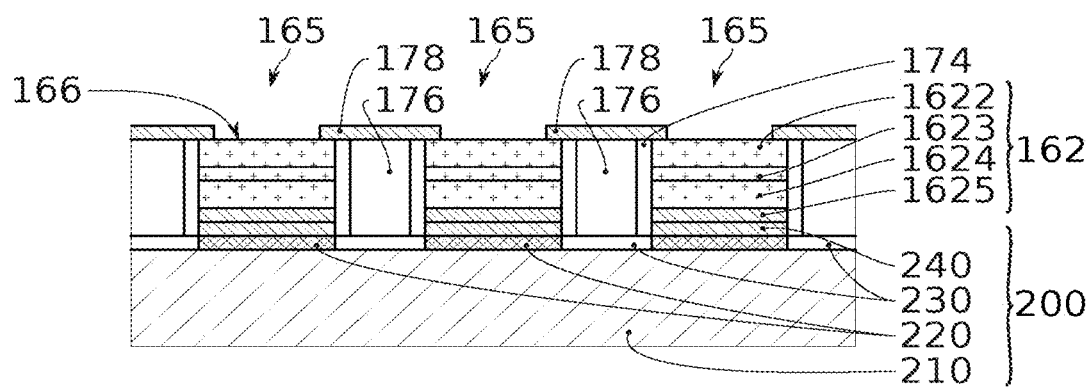

FIG. 3E shows a step that follows the step in FIG. 3D, during which the trenches 170 are filled with an insulating material 176, for example silicon oxide. By way of example, a layer of silicon oxide sufficiently thick to fill the trenches 170 is deposited on the entire upper surface of the assembly, then a planarisation step, for example by chemical mechanical polishing (CMP), is implemented to remove the silicon oxide from the upper surface of the LEDs 165. At the end of this step, the upper face 166 of the device is substantially flat and comprises alternating insulating regions 174, 176 and nitride regions 1622. As an alternative, the step of filling the trenches 170 (FIG. 3E) and the step of passivating the sides of the LEDs (FIG. 3D) can be combined.

FIG. 3E also shows a step that follows the step of filling the trenches 170 with an insulating material 176, during which one or metallisation 178 or more are formed on the upper face 166 of the device, in contact with the cathode regions 1622 of the LEDs 165. In this example, the cathode regions of the LEDs 165 are all connected to the same metallisation 178. The metallisation 178 comes into contact, on each of the LEDs 165, with a peripheral part of the upper face of the cathode region 1622 of the LED. At each of the LEDs 165, a central part of the LED is, however, not covered by the metallic grid 178, so as to enable the passage of the light emitted by the LED. Indeed, in the shown example, the display device is intended to be watched from the side of its upper face 166. The metallic grid 178 can be connected to the control circuit 200, for example by means of one or several vias (not shown) formed in the active stack 1622-1624 or in the insulating material 176 used to fill the trenches 170, for example in a peripheral region of the device.

Figure 3F:
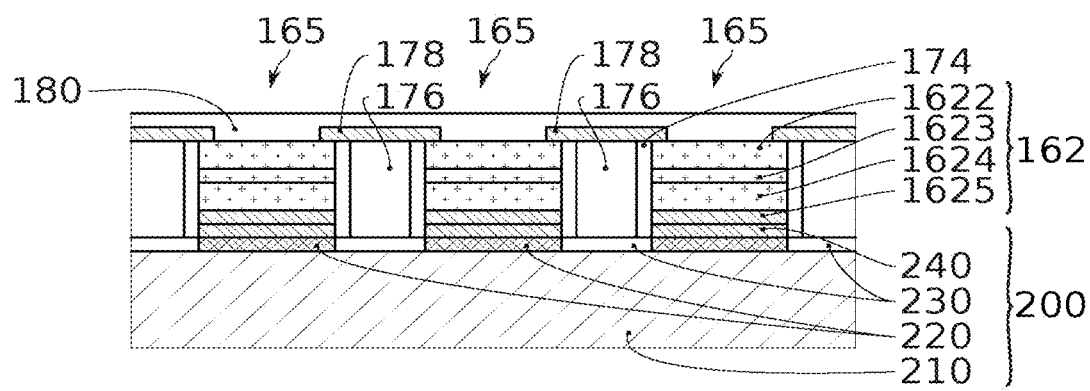

FIG. 3F shows a step that follows the depositing of the metallisations 178, during which an insulating layer 180, for example in silicon oxide, is deposited on substantially the entire upper surface of the device, to protect the metallisations 178 and the visible portions of the gallium nitride layer 162. The insulating layer 180 can be planarized so as to obtain a display device featuring a substantially flat upper surface.

In the embodiment example described in reference to the preceding figures, the depositing of the metallic layers 1625 and 240 on the control circuit 200 and on the active stack 1622-1624 before the placing of the active stack 1622-1624 on the control circuit 200 has several advantages.

In particular, the layers 1625 and 240 enable to improve the quality of the bonding between the two structures. Indeed, although it is possible, the direct bonding of the upper face (in the orientation of FIG. 1A) of the nitride layer 1624 with the front surface 212 of the control circuit 200 (comprising alternating insulating regions 230 and metallic regions 220) is relatively difficult to achieve.

Furthermore, the layer 1625 can advantageously be chosen to achieve a good ohmic contact with the nitride layer 1624. Indeed, the material of the metallic pads 220 of the control circuit 200, for example copper or aluminium, may not be adapted to achieve such an ohmic contact.

Furthermore, the layers 240 and/or 1625 can comprise a metal that reflects the light emitted by the LEDs 165, so as to increase the emission efficiency and avoid light losses in the control circuit 200.

Also, the layer 240 and/or the layer 1625 can be chosen to prevent metal of the connection pads 220 of the control circuit 200, for example copper, from diffusing into the gallium nitride layer 1624, which could in particular reduce the quality of the ohmic contact with the gallium nitride layer 1624.

In practice, each of the layers 240 and 1625 can be a single layer or a stack of one or several layers of different metals, enabling to ensure all or part of the abovementioned functions.

By way of example, the layer 240 comprises an upper layer made of a metal of the same nature as the upper layer 1625, said metal being selected to achieve a good bond between the two structures during the placement step shown in FIG. 2E, for example from the group that comprises Ti, Ni, Pt, Sn, Au, Ag, Al, Pd, W, Pb, Cu, AuSn, TiSn, NiSn, or an alloy of all or part of these materials. The stack formed by the layers 240 and 1625 can further comprise one or several layers made of metals adapted to reflect the light emitted by the LEDs, for example silver. Furthermore, the stack formed by the layers 240 and 1625 can comprise one or several layers adapted to block the diffusion of metals such as copper or silver comprised in the stack 240/1625 and/or in the metallic pads 220, for example layers of TaN, TiN, WN, TiW, or a combination of all or part of these materials.

As an alternative, the layer 240 and/or the layer 1625 can however be absent. Preferably, at least one among the layers 240 and 1625 is provided, preferably the layer 1625 formed on the side of the active stack 1622-1624 of LEDs.

An example of producing an assembly 100 identical or similar to that shown in FIG. 2A is now described, in reference to FIGS. 4A to 4G. This assembly 100 comprises the growth substrate 101, topped by a semipolar nitride structure 160.

To begin with, in reference to FIGS. 4A to 4E, a non-limiting example of a method to produce a growth substrate 101 is described in detail.

In a second step, in reference to FIGS. 4F to 4G, a non-limiting example of a method to enable the growth of the semipolar nitride structure 160 from the growth substrate 101 is described in detail.

Producing the Growth Substrate 101

Figure 4A:
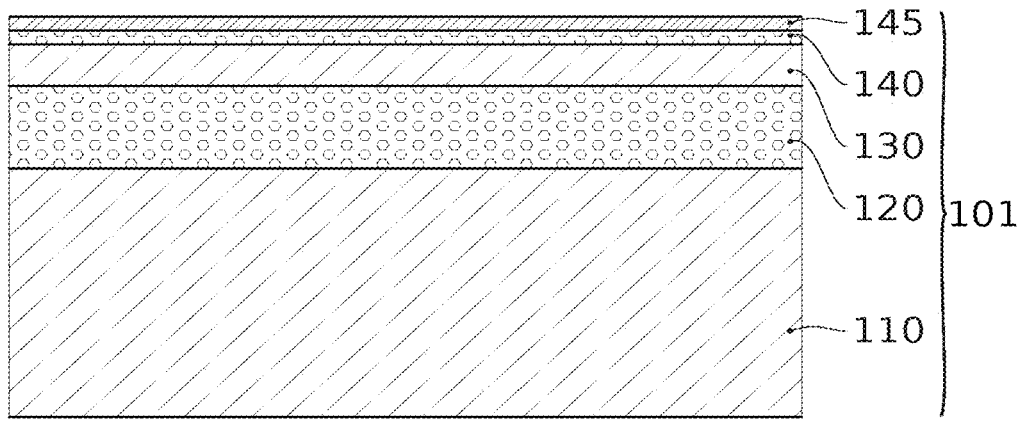
FIGS. 4A to 4G show an example of a method to produce an assembly comprising a semipolar nitride layer. This method can be implemented to produce the assembly shown in FIG. 2A.

A step, shown in FIG. 4A, comprises producing a stack that includes, in succession and starting from a support substrate 110: a barrier layer 120, a crystalline layer 130, a first masking layer 140, and a second masking layer 145.

For example, the support substrate 110 is made of silicon. The barrier layer 120 is a layer of SIO2 and the crystalline layer 130 is a silicon layer. The stack 110, 120, 130 forms preferably an elaborate substrate of the silicon on insulator (SOI) type, wherein the layer 130 constitutes the layer usually referred to as top Si. As mentioned above, this stack can also be of the silicon on sapphire type, wherein the crystalline layer 130 is a silicon layer.

The orientation of the superficial crystalline layer 130 of the substrate, typically made of silicon, features an orientation deviation of the crystal plane (001) of 7° towards [110], so as to subsequently obtain an epitaxial GaN layer of orientation (10-11).

The first masking layer 140 is a hard mask, for example made of SiO2 or of silicon nitride (SiN). This hard mask 140 features for example a thickness of 50 nanometres. This hard mask 140 is covered by a second masking layer 145, typically made of or based on resin.

Figure 4B:
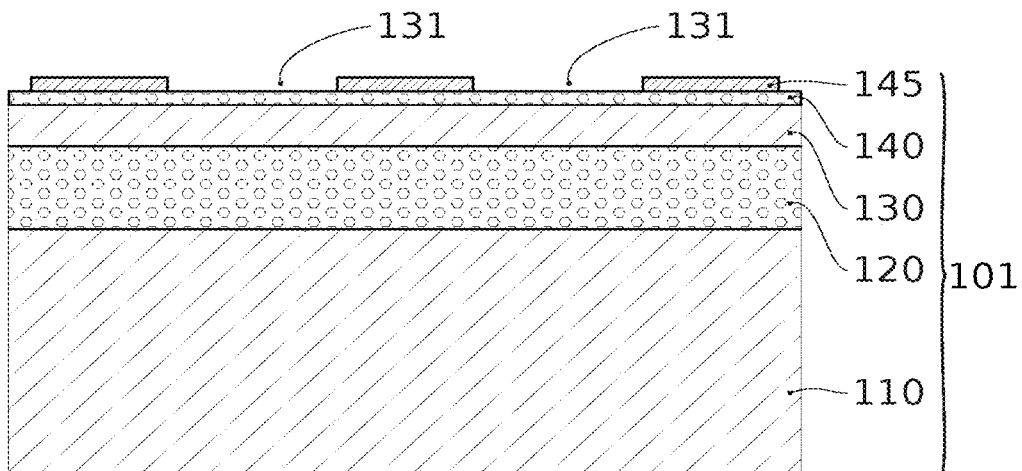
Figure 4C:
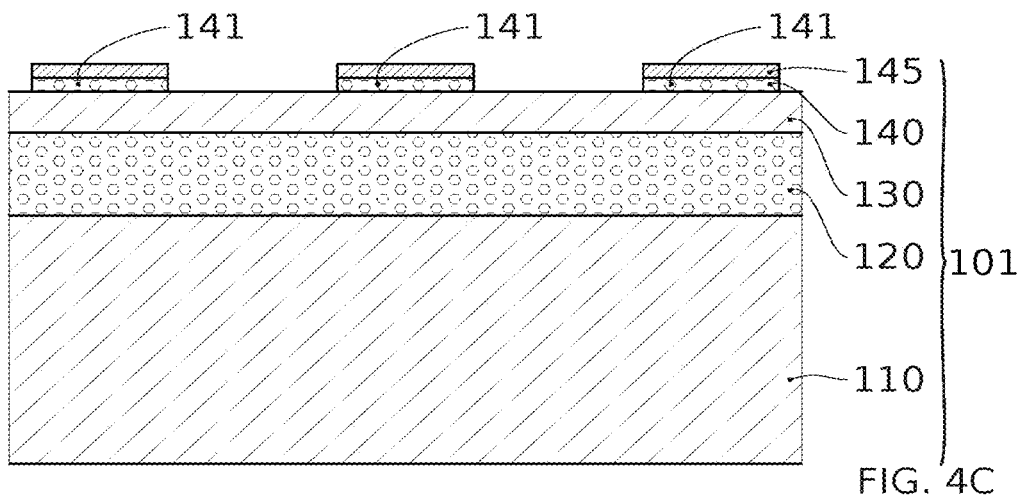
Figure 4D:
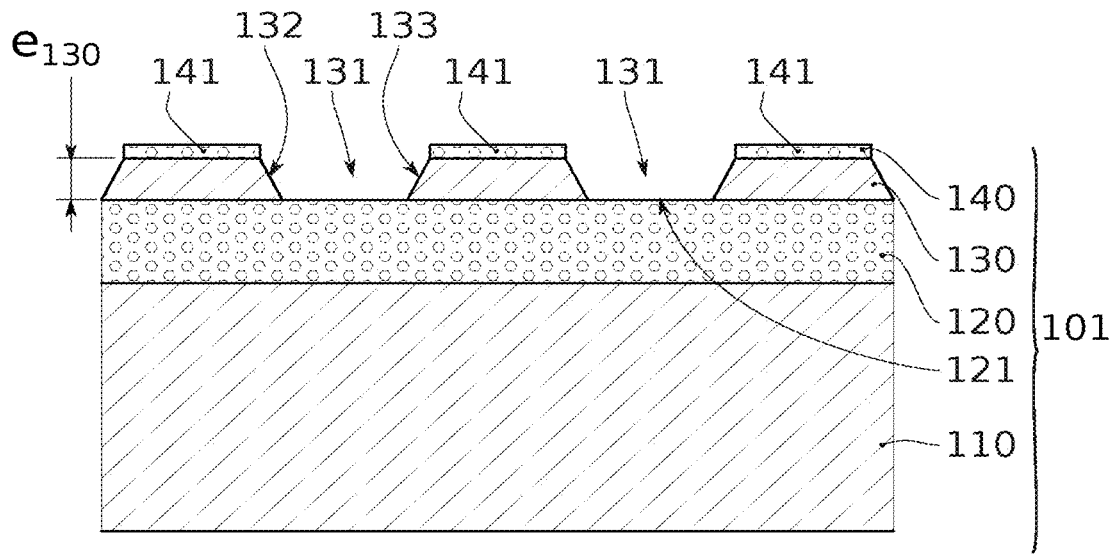
Figure 4E:
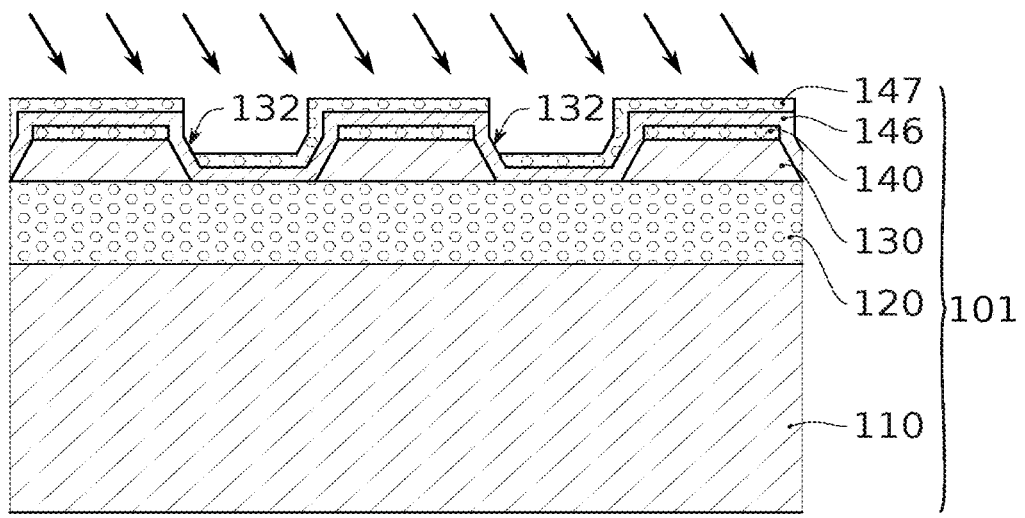
Figure 4F:
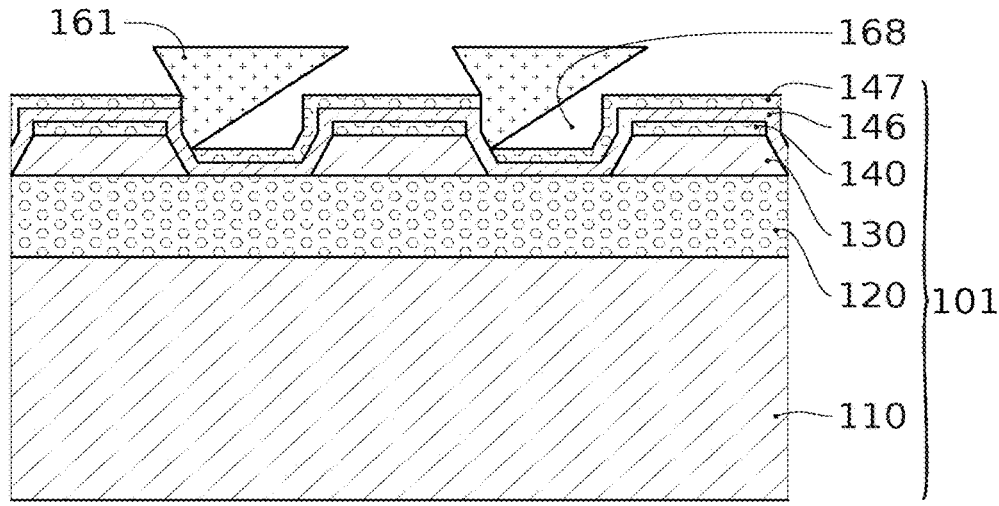
Figure 4G:
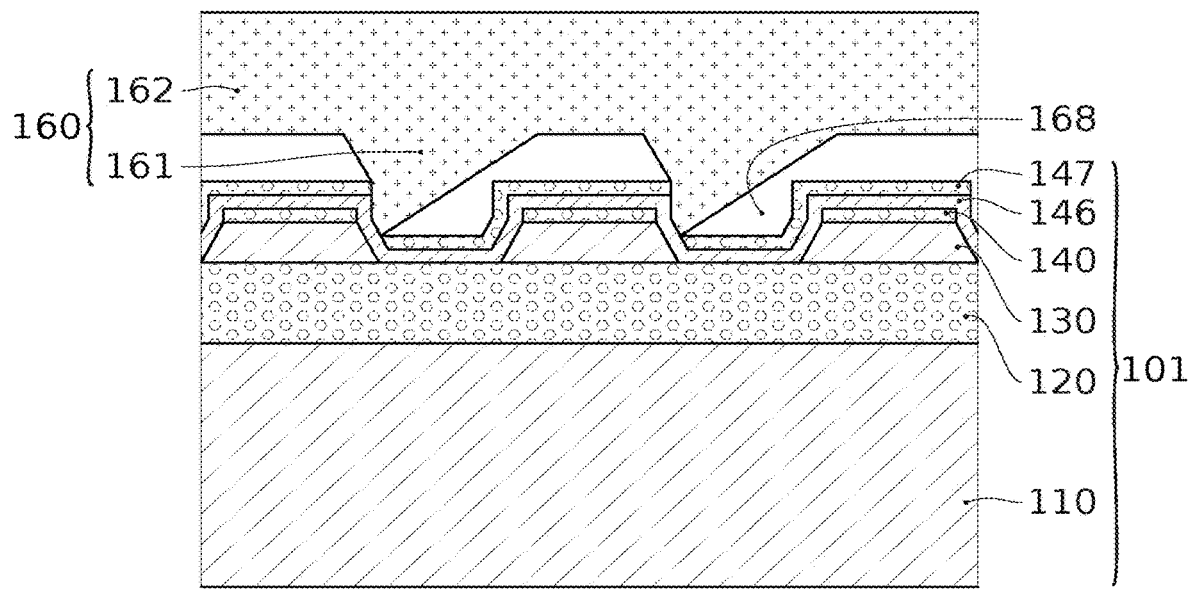

As shown in FIGS. 4B to 4D, grooves 131 are then etched in the crystalline layer 130. These grooves 131 are hollow patterns, thus forming trenches.

For this purpose, parallel strips 141 are made in the masking layer 140. This structuring of the masking layer 140 is performed in the traditional manner using lithography and etching through the layer 145 forming a mask of resin. The step of structuring the resin mask 145 and the step of etching the masking layer 140 to form the hard mask are shown in FIGS. 4B and 4C. The hard mask thus forms parallel strips 141 covering the crystalline layer 130 and leaving bare other parallel strips of this crystalline layer 130.

The parallel strips 141 are oriented in a predetermined crystalline direction of the crystalline layer 130. The crystalline layer 130 features an inner face opposite an upper face 121 of the barrier layer 120 and an outer face opposite the inner face, said outer face also being referred to as upper surface. The direction of orientation of the parallel strips 141 must correspond to a direction shared by the plane of the outer face of the crystalline layer 130 and by the plane <111> that is intended to be revealed by chemical etching. This direction is a direction of type <110>. Thus, the strips 141 are parallel with the intersection of the plane of the upper surface of the crystalline layer 130 and of the plane <111>.

In order to reveal the facets 132 with an orientation {111}, the crystalline layer 130 is then chemically etched, using for example KOH (potassium hydroxide) or tetramethylammonium hydroxide (TMAH).

The grooves 131 thus formed by etching are parallel with the strips 141. Thus, these grooves 131 define parallel grooves oriented along the directions shared by the plane of the outer face of the crystalline layer 130 and by the plane <111>.

In the non-limiting example shown in FIGS. 4A to 4G, the etching stops automatically when the barrier layer 120 is reached. Thus, the etching stops before the facets 132 with an orientation {111} meet one another, as would be the case in the absence of a barrier layer, i.e., by using a bulk crystalline substrate.

Thus, instead of determining the height of the facets 132 with an orientation {111} by the etching time, the height is entirely determined, using the method according to the invention, by the thickness e130 of the crystalline silicon layer 130 of the SOI substrate.

Being able to accurately control the depth of the grooves 131 and to obtain trenches with a reduced thickness enables to substantially reduce the surface wherefrom the crystallites 161 will form. This enables to considerably reduce the number of dislocations generated and spreading to the surface of the semipolar layer. The semipolar layer 162 formed after coalescence of the crystallites thus features a substantially reduced number of dislocations. The LEDs formed in this layer therefore feature significantly improved performance levels.

Furthermore, as the phenomenon of melt-back etching occurs randomly on the surface of the crystalline layer 130, a reduction of the surface of the facets 132 enables to considerably reduce, and even to eliminate the risk of seeing this phenomenon appear. It should be noted that the melt-back etching phenomenon is caused by the high reactivity between silicon and GaN and leads to unwanted etching of the silicon by the gallium.

The height e130 of the facet 132 depends on the depth of the groove 131. The height of the facet 132 and the depth of the groove 131 are measured perpendicularly to the plane wherein extend primarily the different layers 110, 120, 130, i.e., vertically in FIGS. 4A to 4G.

Therefore, the grooves 131 preferably have a flat bottom 121. This bottom is formed by the upper face 121 of the barrier layer 120.

When the depth e130 of the grooves 131 is less than or equal to 900 nanometres, the results in terms of reducing the melt-back etching phenomenon are particularly significant.

Furthermore, by providing the barrier layer 120, and thereby producing facets that have a controlled size and are a lot more homogeneous on the wafer, the method enables to produce semipolar nitride layers 162 that are flat and have a more homogeneous thickness.

Furthermore, chemical baths are the source of inhomogeneities. The use of SOI substrates, or more generally, of SOX substrates, enables to obtain facets 132 that are highly homogeneous in their height over the entire surface of the substrate, and having a controlled thickness, despite the inhomogeneities caused by the chemical etching. The residual lack of uniformity is then limited to the thickness e130 of the silicon layer of the SOI, which is only of a few percentage points, as specified by the different suppliers of these types of substrates. This is true for substrates with a large diameter (typically 300 mm) and for superficial silicon layers with a reduced thickness (of less than 20 nm).

It should be noted that the present invention also applies in the case where the crystalline layer is not on top of a barrier layer 120 and forms, for example, a bulk substrate.

According to one embodiment, in particular when the crystalline layer 130 is in silicon and the nitride layer that is intended to grow by epitaxy is made of GaN, a buffer layer 146 made of AlN is deposited at the contact surface of the crystalline silicon layer 130. This enables to limit, and even to prevent the apparition of the "melt-back etching" phenomenon, which leads to unwanted etching of the silicon by the gallium. This buffer layer 146 can be deposited on the entire upper surface of the growth substrate 101, as shown in FIG. 4E. Thus, in this example, the facets 132 are formed by or are covered by the buffer layer 146.

According to one embodiment, once the grooves 131 are made, and possibly the buffer layer 146 is deposited, a mask 147 is then formed and configured to cover the entire upper surface of the growth substrate 101, with the exception of the facets 132 with an orientation {111}. This mask 147 is shown in FIG. 4E.

Thus, this masking step is performed so that the facets 133 with an orientation {111} opposite the facets 132 featuring a crystalline orientation {111} are masked. The method to produce this mask 147 typically comprises the deposition of a material comprising at least one among: silicon oxide (SiO2), silicon nitride (SiN), or titanium nitride (TiN).

According to a first embodiment, shown in FIG. 4E, the deposition of said mask 147 is an angular deposition executed so that the entire upper surface of the crystalline substrate 130 is masked, with the exception of said facets 132 that feature a crystalline orientation {111}. The tilt angle of the deposition is only one part of the groove 131, corresponding to the facets 132, and is therefore not exposed and does not receive the deposited material. This step is performed using standard equipment known as "ion beam sputter" (or IBS), wherein the deposition angle can be adjusted. This deposition with a tilted angle can also be achieved using the technique called "Electron Beam Physical Vapour Deposition" (EBPVD), wherein a target anode in a vacuum is bombarded by an electron beam.

As an alternative to these techniques enabling a tilted deposition of the material forming the mask 147, it is also possible to deposit a masking layer of a material comprising at least one among: silicon oxide (SiO2), silicon nitride (SiN), titanium nitride (TiN), and, subsequently to the deposition, the facets 132 with an orientation {111} are laid bare to reveal them and to enable the contact between the nitride that is to be epitaxially grown and the facets 132 with an orientation {111}.

Growth of the Semipolar Nitride Layer

As shown in FIG. 4F, the crystallites 161 that have been subsequently grown from the facets 132 with an orientation {111} all are of substantially equal size, allowing for the uncertainty caused by the variation of thickness e130 of the crystalline layer 130, thereby greatly facilitating the coalescence and the production of flat semipolar surfaces 162 over the entire extent of a substrate such as that shown in FIG. 4G.

In the non-limiting example shown in FIG. 4F, the layer of AlN 146 is epitaxially grown directly at the contact with the facets 132 with an orientation {111} of the crystalline layer 130. Then, from the layer 146, the nitride layer 162, for example made of GaN, is grown.

The dimensions of the facets 132 with an orientation {111} obtained from the crystalline layer 130 are preferentially in a range of values from 20 nm to 2 μm, corresponding to a thickness e130 range of the crystalline layer 130 in the order of 10 nm to 1 μm, depending on the crystalline orientation of the initial surface. The repetition periods of the strips 131 of the mask 140 are preferably in a range of values from 2 to 10 μm.

According to an embodiment that is not shown, there is an additional step after the step of obtaining the plurality of parallel grooves and before the step of epitaxially growing the crystalline layer. This additional step comprises the production of a plurality of parallel trenches that extend in a direction that has undergone a rotation with respect to the main direction along which the parallel grooves 360 extend. Thus, the grooves 131 are discontinuous.

According to one embodiment, the trenches are rotated, with respect to the grooves, by an angle that is greater than 40°, and preferably ranging from 50° to 90°, this angle being measured in a plane parallel with the main plane wherein extends the support substrate 110.

Thus, the trenches intersect with the continuous grooves 131 so as to form a matrix of individual facets, each featuring a crystalline orientation {111}. During the step of epitaxial growth, the material only grows from said individual facets that feature a crystalline orientation {111} and that form said matrix. Preferably, the trenches and the grooves 131 each have a bottom, the bottom of the trenches being at the same depth or lower than the depth of the bottom of the grooves 131.

The formation of the trenches, tilted with respect to the grooves 131, enables to reduce the available surface areas of the facets featuring a crystalline orientation {111}. This optional but advantageous embodiment thus enables to further reduce the surface area supporting the epitaxial growth, thereby reducing the defects during the epitaxial growth generated at the GaN/AlN/Si or AlN/Si interface, while imposing the growth in the adequate direction +c.

Specific Embodiment Example

A specific example of a method for producing a growth substrate 101 and a specific example of growing a semipolar GaN layer 162 from said growth substrate are detailed below. This example and other information can be found in the publication Rami Mantach J. Appl. Phys. 125, 035703 (2019.

Producing the Growth Substrate 101

The masking layer 140 is made of SiO2. It has a thickness of 50 nanometres. It is deposited directly at the contact surface of the crystalline layer 130. It is produced by ion beam sputter (IBS). The crystalline layer 130 is made of crystalline silicon. It has a thickness of 150 nanometres. The barrier layer 120 is a layer of SiO2. It has a thickness of 500 nanometres. The support substrate 110 is made of silicon.

The strips 141 are arranged along the direction [110]. They are defined by standard photolithography with a period of 5 μm. For example, the strips 141 have a width of 2.5 micrometres and the openings between the strips 141 also have a width of 2.5 micrometres.

The mask 140, made of SiO2 in this example, is etched by inductively coupled plasma (ICP). The sample is then cleaned for 30 seconds in a buffered oxide etch (BOE) solution to eliminate the native oxide, which often prevents the KOH from etching the silicon. The substrate is then exposed to wet etching with KOH, revealing the opposite facets 132 (111) and 133 (11 1). In this example, these facets 132, 133 have a tilt of 48° and 60°, respectively, with respect to the upper Si surface (6° off (001) top Si). By using the bulk Si substrate instead of an SOI substrate, the etching would have been automatically halted once a V-shaped groove was entirely formed. This would have resulted in two large opposite facets {111}, with a width of 2 to 3 μm. This would not have been optimal for the reasons detailed above, in terms of defect density, and in terms of homogeneity and planarity of the obtained nitride layer. The use of the barrier layer 120 to perfectly control and limit the surface of the facets 132 enables to limit, and even to fully eliminate these disadvantages.

A buffer layer 146 of AlN with a thickness of 50 nm is deposited by epitaxy, at 1210° C. by MOVPE (metalorganic vapour phase epitaxy). The advantages afforded by the presence of this layer of AlN to limit the occurrence of the melt-back etching phenomenon were mentioned above. The metal precursor used is trimethylaluminum.

The second mask 147 is a mask of SiO2. It is deposited using IBS-type equipment, with a tilt angle that enables to leave bare the facets 132 tilted at 60° and made of AlN, i.e., where the GaN growth is to be initiated.

Forming the Semipolar GaN Layer 162

Advantageously, the same MOVPE reactor than the one used previously for the deposition of the buffer AlN layer 146 is used for the selective growth of the semipolar GaN layer 162. The precursors are trimethylgallium (TMGa) and ammonia (NH3).

The growth process can be divided into two steps.

The first step comprises the growth of the GaN crystallites 161 or pyramids. This step is performed, for example, at a temperature of 1090° C. The pressure can be in the order of 300 Torr. The V/III ratio of the flow rate of the gases injected in the reactor can be 1500.

A second step aims at achieving the coalescence of the crystallites 161. The growth continues at the same temperature but at a lower pressure (100 Torr) and with a lower V/III ratio (650).

It should be noted that if these same growth parameters are applied using large growth facets 131 made of Si (which is typically the case with a bulk substrate of Si), this can lead to parasitic growth. To prevent this, the pressure and flow rates of the gases TMGa and NH3 must be adjusted.

In the paragraphs below, the advantages associated with obtaining the nitride layer by implementing the method described above are detailed.

Firstly, this method enables to produce a semipolar layer. This enables to significantly reduce polarisation effects, in particular the quantum-confined Stark effect in the quantum wells of the LED heterostructures associated with the semipolar material.

Furthermore, the epitaxy of heterostructures with quantum wells on structured bulk silicon and on structured SOI, such as described above, enables to grow layers free of constraints or subject to few constraints during the coalescence.

This enables to integrate indium in the multiple quantum wells. It is then possible to produce LEDs that emit with a better quality in the wavelength range of green, and even to produce LEDs that emit in the wavelength range of red. Semipolar InGaN buffer layers, called metamorphic, have for example been epitaxially grown and feature very reduced, or non-existent, constraints.

Furthermore, this enables to produce thicker epitaxial growths that feature no cracks. However, generally speaking, with the solutions from prior state of the art, obtaining thick epitaxially grown layers leads to numerous cracks, and even the fracturing of the obtained layer in many cases.

Figure 5A:
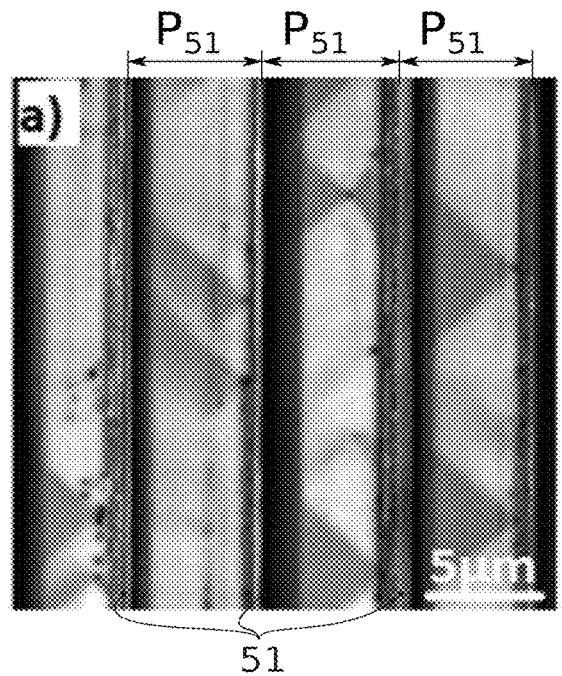
FIGS. 5A and 5B are cathodoluminescence images of the distribution of emerging dislocations for a semipolar GaN layer.
Figure 5B:
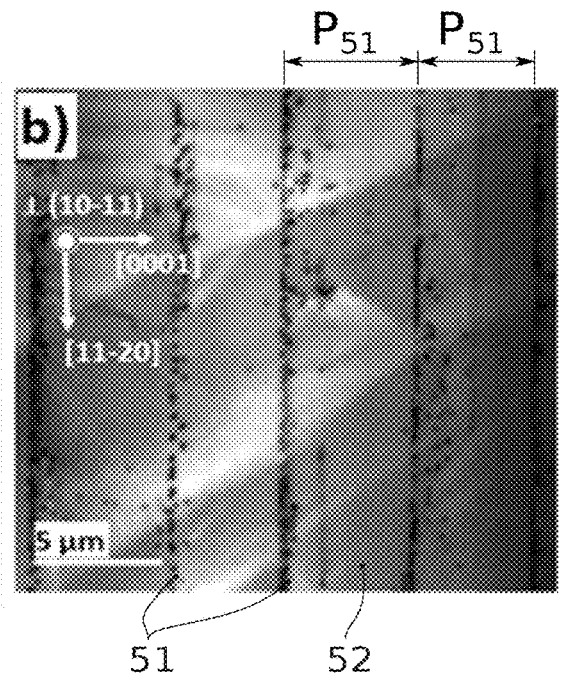

Furthermore, the epitaxial growth of heterostructures with quantum wells, such as described above, enables to generate fewer dislocations, which enables an improved radiative efficiency of the microLEDs. The obtained layers feature average densities of dislocations ranging from a few 10E6 (for growth techniques referred to as Aspect Ratio Trapping) to a few 10E7 (on standard SOI). FIGS. 5A and 5B are cathodoluminescence images of a layer of GaN wherein each black dot corresponds to an emerging dislocation. The dislocations are confined along the zones 51 forming lines that correspond to the coalescence zones of the strips. The zones 51 thus correspond to the coalescence boundaries. The zones 52 between these lines of dislocations feature very low dislocation densities. The location of the microLEDs in these zones 52 with little to no defects is an important advantage that can be used to increase the radiative efficiency, in particular for big wavelengths. An example of a good use of these zones 52 with a very low density of defects is described in detail below, in reference to FIGS. 7A and 7B.

Furthermore, the epitaxial growth of heterostructures with quantum wells, such as described above, enables to achieve a smaller contact or adherence surface between the epitaxially grown semipolar structure 160 and the growth substrate 101. This contact surface is even smaller when the growth substrate 101 comprises a barrier layer 120 that limits the depth of the grooves 131 and therefore the surface area of the growth facets 132. It is then possible to adjust the conditions to ensure that the adherence of the semipolar structure 160 is sufficient to enable a controlled execution of the method, in particular during the epitaxial growth, while facilitating the separation of this semipolar structure 160 from its growth substrate 101.

It is possible, for example, that the detachment is triggered only by annealing. Alternatively, it is possible that the detachment is facilitated by annealing. It is possible that the detachment is partially performed, and preferably fully performed, by the application of a mechanical constraint, or by the use of ultrasounds, as described in reference to FIG. 2F.

Figure 5C:
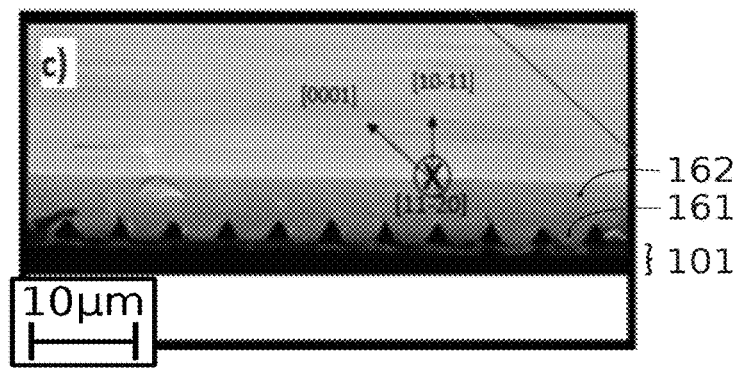
FIGS. 5C to 5D are images obtained by scanning electron microscopy showing increasingly expanded views of a cross-section of an epitaxially grown semipolar nitride layer on a growth substrate.
Figure 5D:
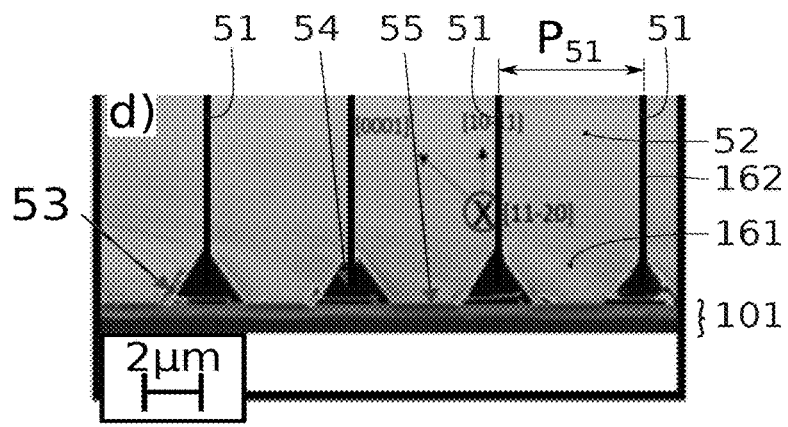

FIGS. 5C and 5D are images obtained by scanning electron microscopy of a cross-section of an assembly comprising an epitaxially grown semipolar structure 160 resting on its growth substrate 101. In FIG. 5D, which is an expanded view of FIG. 5C, the zones 51 and 52 are referenced. The regions 52, 54, 55 are also referenced. These regions 53, 54, 55 contribute to the adherence of the semipolar structure 160 to its growth substrate 101. The region 53 corresponds to the surface of the facets 132 wherefrom the epitaxy is initiated. The region 54 corresponds to an "empty" space that does not allow to retain the semipolar structure 160 on its growth substrate 101. The region 55 corresponds to the surface of the interface between the semipolar structure 160 and the upper face 121 of the barrier layer 120, typically a layer of SiO2. This interface contributes little or not at all to the adherence of the semipolar structure 160 to its growth substrate 101. It appears that the surface of the region 53 is very small compared with the other regions 54, 55.

Figure 6A:
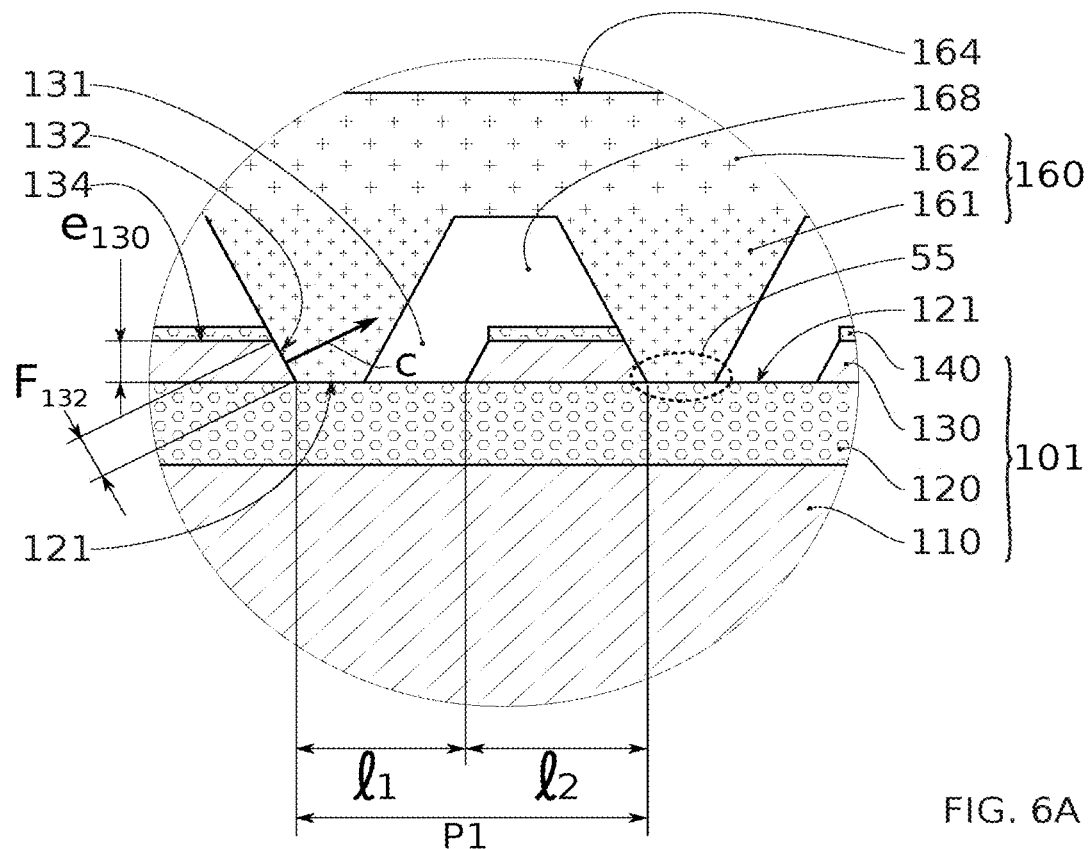
FIGS. 6A and 6B are schematic views taken from the view in FIG. 2B showing various parameters that are taken into account when controlling the adherence between the nitride structure and its growth substrate.
Figure 6B:
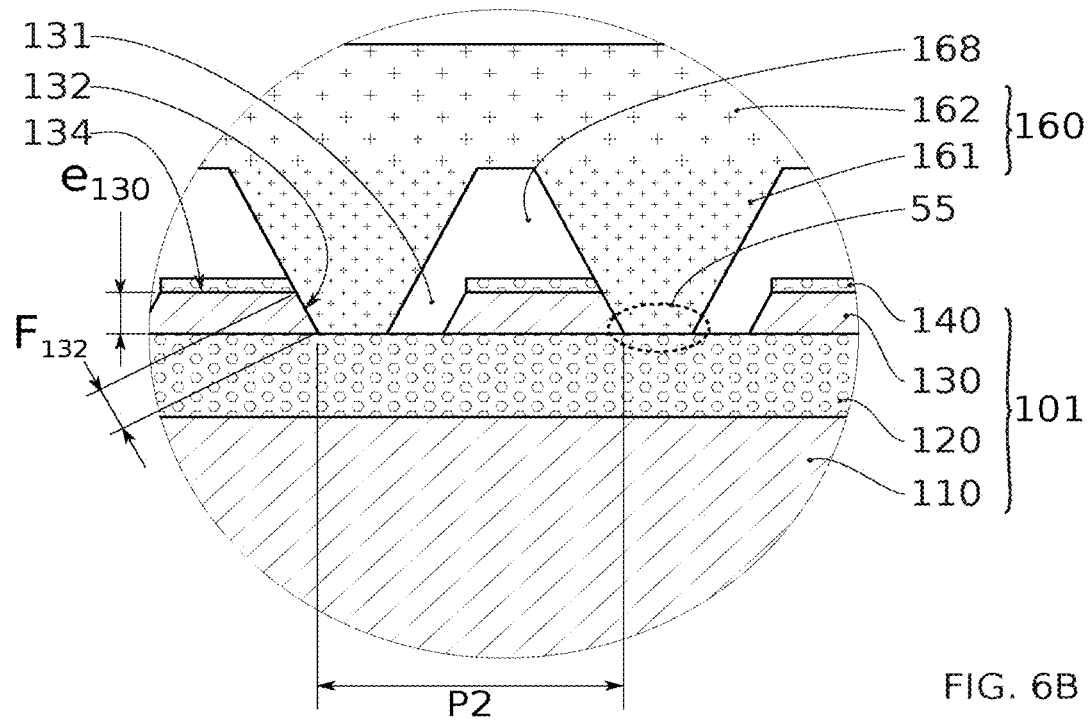

FIGS. 6A and 6B show schematically the interface between the semipolar structure 160 and a growth substrate 101 of the SOI type. These figures highlight the parameters that influence the adherence of the semipolar structure 160 to its growth substrate 101, and as a consequence, the force to be applied to separate these two assemblies 160, 101.

If the cohesive forces between the crystallites 161 and the upper face 121 of the barrier layer 120 (interface 55 referenced in FIG. 6A) are ignored, it is possible to consider that the force required to cause the delamination of the semipolar structure 160 from its substrate 101 depends on the ratio of the surface area of the epitaxially grown layer, typically the surface of its second face 164 turned towards the outside of the assembly 100, to the developed surface areas of the facets 132 (more specifically, the sum of the surface areas S132 of the facets 132) of the growth substrate 101 used for the epitaxy. In an initial approximation, this amounts to considering the ratio of the surface S132 of the facets 132 to the period P1, P2 of the grooves 131. The periods P1 and P2 are referenced in FIGS. 6A and 6B, respectively. It is also possible to consider the ratio of the width F132 of the facets 132 to the period P1, P2 of the grooves 131. The width F132 of the facets 132 is referenced in FIGS. 6A and 6B. The width F132 is measured:

a. in a plane perpendicular to the main plane wherein extends the upper face of the crystalline layer 130 (and the upper face 121 of the barrier layer 120 if it is present), for example the sheet plane of the FIGS. 6A and 6B.
b. along the tilt direction of the facets 132, from a summit 134 of the grooves 131 to a bottom 121 of the grooves 131.

If a first assembly 101, 160 is considered with a period P1, such as shown in FIG. 6A, a force F1 is required to achieve a detachment of the semipolar structure 160 from its growth substrate 101. If a second assembly is considered, as shown in FIG. 6B, for which the ratio P/F132 is lower, then the force must be increased to obtain said detachment. In this FIG. 6B, the width F132 is identical to that in FIG. 6A, and the period P2 is smaller than the period P1. It is therefore necessary to apply a force F2 greater than the force F1 to obtain the detachment. Thus, the ratio P1/F132, respectively P2/F132, significantly contributes to controlling the retention of the semipolar structure 160 with respect to its growth substrate 101. The higher this ratio, the lower the retention, and the growth substrate 101 can then detach itself easily. To facilitate the detachment, it is necessary to minimise the surface area S132 of the facets 132, and therefore their width F132.

According to one embodiment P/F132≥3. Preferably, P/F132≥5. Preferably, P/F132≥10.

Other parameters help facilitate the detachment of the semipolar layers from the growth substrate. These parameters can be used separately or together. There parameters are described below. These parameters can be implemented in the context of a metalorganic vapour phase epitaxy (MOVPE). Nonetheless, it is perfectly possible to consider other epitaxy techniques for the purpose of the present invention.

During the epitaxy, the oriented growth should be facilitated along the direction "c" (this direction is referenced in FIG. 6A), at least until the crystallites 161 begin to coalesce. Conversely, growth occurring predominantly in the semipolar planes should be avoided. This enables the different crystallites 161 to join one another quickly without excessively covering the face 121 of the barrier layer 120. The parameters of the epitaxial growth can then be modified to favour a thickening of the semipolar layer 160 that is forming.

For this purpose, during the growth of the crystallites 161, it is possible to work with low pressures. According to an advantageous embodiment, during the epitaxy, the pressure $P_{epitaxy}$ is of less than 300 Torrs. Preferably, $P_{epitaxy} \leq 200$ Torrs. Preferably, $P_{epitaxy} \leq 150$ Torrs. Preferably, $P_{epitaxy}$ is equal to 100 Torrs.

In an alternative or cumulated manner, at a low pressure, during the growth of the crystallites 161, it is preferable to also work with a low ratio of the flows of materials V/III According to one example, this ratio is less than or equal to 2000. Preferably it is less than 1000, advantageously it is in the order of 650.

According to one example, the temperature $T_{epitaxy}$ is greater than 1050° C., and preferably $T_{epitaxy}$ is greater than 1100° C. A higher temperature allows to increase the mobility of the Ga atoms deposited at the surface, preventing them in particular from accumulating on the upper face 121 of the barrier layer 120, which would otherwise have caused the layer 160 to adhere to the barrier layer 120 and would have rendered its subsequent detachment more difficult.

It is also preferable to consider the parameter relating to the rugosity of the barrier layer 120. For this layer 120, a smooth material is preferred, featuring little rugosity to limit the deposition on this surface, thereby limiting the adherence of the epitaxially grown layer on this barrier layer 120. Preferably, for the barrier layer 120, a material is chosen for a selective growth that features a surface roughness with little rugosity, such as an oxide. $SiO_2$ is a good candidate. Thus, in practice, the barrier layer is the layer that forms the SOI and is therefore often a layer of $SiO_2$. Its rugosity is then that of the Si/thermal $SiO_2$ interface, or of the Si/deposited $SiO_2$ interface.

Another parameter relates to the width (this width "I1" is referenced in FIG. 6A) of the etched zone between two mesas formed by the crystalline layer 130 supporting the facets 132. This width I1 must be sufficiently important relative to the width I2 of the mesa (this width "I2" is referenced in FIG. 6A). The ratio e=I2/I1≤20%, preferably e≤10%.

It is also possible to use shading effects to prevent the growth of the semipolar facet 132 under the pyramid. For this purpose, it is for example possible to use methods such as Molecular Beam Epitaxy (MBE) during this phase of growth. For example, it is possible to resume the MBE on crystallites originally formed by MOVPE. In this case, it is preferable that the conditions used during the MBE growth enable a selective growth, i.e., without deposition on the barrier layer.

Figure 7A:
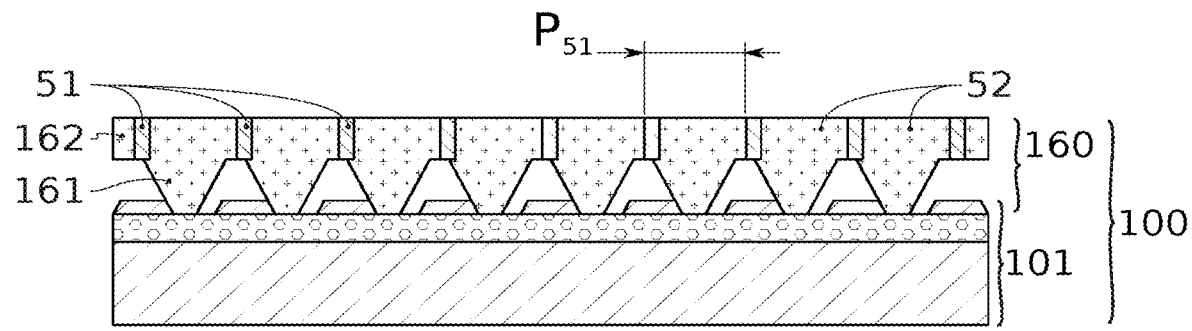
FIGS. 7A and 7B show a specific embodiment, wherein the assembly and the control circuit are aligned according to the distribution of the dislocations in the semipolar nitride layer.
Figure 7B:
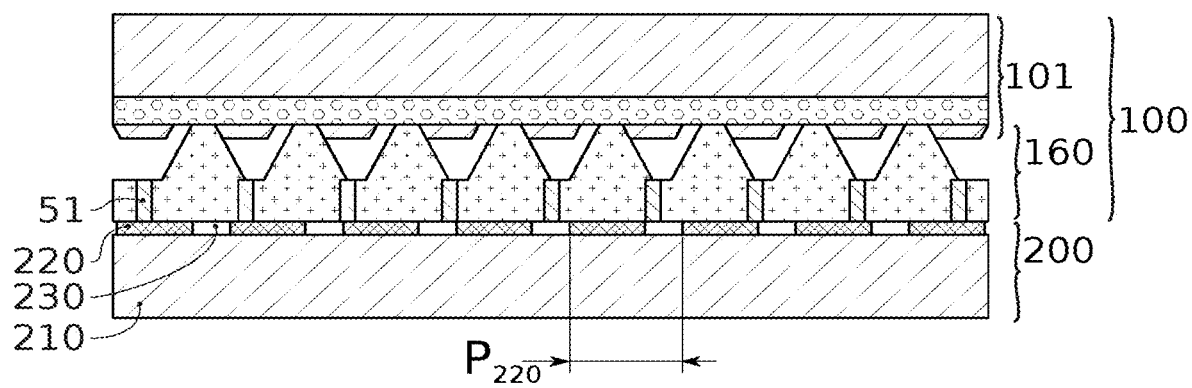

A particularly advantageous embodiment is now described in reference to FIGS. 7A and 7B.

As mentioned previously in the paragraphs referring to FIGS. 5A to 5D, the defects that occur during the epitaxial growth, in particular dislocations at the coalescence boundaries of the crystallites 161, are concentrated in narrow zones 51. Conversely, the wide zones 52 are void of defects, or have a very low rate of defects. These zones 51 and 52, illustrated in the photos of FIGS. 5A and 5B, are also schematically shown in FIG. 7A. The zones 51 of defect concentration are distributed periodically in the semipolar nitride layer. This period P51 is intimately linked to the width of the strips 141 of the hard mask 140 and the width of the grooves 131 etched in the crystalline layer 130 of the growth substrate 101.

In a particularly advantageous manner, a control circuit 200 is configured so that the electric connection pads 220 are a function of this period P51, so that the majority, and preferably all the zones 52 with low rates of defects are located opposite a single electric connection pad 220. Thus, a same zone 52 with low rates of defects is not in contact with two electric connection pads 220.

According to one example, the period of the crystallites 161, and therefore the period of the zones 51 of defect concentration, and the distribution of the electric connection pads 220 are adapted to achieve this. Preferably, the electric connection pads 220, at least some of them and preferably all the pads 220, are distributed periodically on the control circuit 200, according to a period P220.

According to a non-limiting example, P51=X*P220, with X ranging from 0.8 to 1.2, and where X preferably ranges from 0.9 to 1.1, and X preferably ranges from 0.95 to 1.05. This enables to achieve an accurate connection of each of the LEDs 165 to the pads 220, while also reducing the positioning constraints of the assembly 100 on the control circuit 200.

The period P51 preferably comprises the width of a zone 51 to which is added the width of a zone 52. Thus, P51 represents the distribution periods of both the zones 51 and the zones 52. The width of these zones 51, 52 is preferably measured along a direction parallel with the plane of the first and second faces 163, 164 of the epitaxially grown layer, and perpendicular to the main direction of extension of the grooves 131 or strips 141.

According to an optional but particularly advantageous embodiment, the zones 51 with high concentrations of dislocations are located opposite the regions 230 with insulating material 230 separating the adjacent pads 220. In a more general manner, the semipolar structure 160 is configured, along with the step of opening the trenches 170 used to insulate each LED 165, so that the zones 51 are located directly below the trenches 170. Thus, during the step of opening the trenches 170, the zones 51 with a strong density of defects are eliminated. The LEDs 165 are formed in the zones 52 with low or non-existent defect densities. The quality of the optoelectronic device is thereby further improved. To implement this embodiment, the distribution, the location, and the size of the zones 51, 52 and of the electric connection pads 220 must be adapted.

Alternatively, and as is shown in FIG. 7B, it is possible that certain zones 51 with concentrations of dislocations are located opposite an electric connection pad 220.

According to one example, the zones 51 feature average densities D51 of dislocations greater than at least K1 times the average densities D52 of dislocations of the zones 52, where K1>10 and preferably K1>100. According to one example, the zones 51 are arranged substantially perpendicular to the main faces of the semipolar nitride layer 162. Preferably, D51 corresponds to a minimum density observed for these zones 51 in the layer 162, and D52 corresponds to a maximum density observed to for these zones 52 in the same layer 162. Alternatively, D51 corresponds to an average density observed for these zones 51 in the layer 162, and D52 corresponds to an average density observed for these zones 52 in the same layer 162.

Preferably, to align the assembly 100 and the control circuit 200 based on their respective periods P51 and P220, the references used are position markers on the control circuit 200.

Considering the above description, it appears clearly that the proposed method offers a particularly efficient solution to obtain, in an inexpensive and reproducible manner, microLEDs with enhanced performance levels.

The proposed method is particularly interesting in the field of microdisplays, for example for augmented reality or mixed reality applications, in the field of ultra-high definition (UHD), or in the field of projectors.

The invention is not limited to the embodiments described above and extends to all embodiments covered by the claims.

The invention claimed is:

1. A method for producing an optoelectronic device comprising nitride-based micro light-emitting diodes (microLEDs), comprising:
    a) providing an assembly comprising at least:
        a growth substrate comprising at least one crystalline layer, the crystalline layer comprising a plurality of parallel grooves, each groove comprising at least two angled facets arranged opposite one another, each facet forming a continuous strip, at least one of said two opposite facets featuring a crystalline orientation {111};
        a nitride structure made at least partially of nitride obtained from at least one element among gallium, indium, and aluminium, the nitride structure comprising:
            a semipolar layer of nitride, featuring a first face turned towards the crystalline layer, the semipolar nitride layer including a stack comprising at least first and second semiconducting layers doped with opposite conductivity types, and
            crystallites extending from said facets having a crystalline orientation {111} to the first face of the semipolar nitride layer,
    b) providing a control circuit featuring a front face that includes or is electrically connected to a plurality of electric connection pads,
    c) placing the assembly on the front face of the control circuit, so that the second layer of the stack is electrically connected to the electric connection pads of the control circuit,
    d) removing the growth substrate by separating the crystallites (161) from the facets featuring a crystalline orientation {111},
    e) removing the crystallites, and
    f) forming trenches in the stack so as to delimit a plurality of islets, each islet being configured to form a microLED and being connected to at least one electric connection pad of the control circuit.

2. The method according to claim 1, wherein the facets having a crystalline orientation {111} have a width and the grooves are arranged periodically according to a period P, a ratio P/width being such that P/width≥3, the width being measured from a summit of the grooves to a bottom of the grooves and along a direction perpendicular to a main direction of extension of the grooves.

3. The method according to claim 1, wherein the step d) of removing the growth substrate comprises application of a mechanical action on at least one among the growth substrate and the nitride structure, the application of a mechanical action comprising initiation of a fracture from an edge of one among the growth substrate and the nitride structure using a blunt object.

4. The method according to claim 1, wherein the semipolar nitride layer comprises alternating first zones and second zones forming strips or lines that are parallel with the grooves, the first zones having first dislocation densities D1 and the second zones having second dislocation densities D2, with D1>K1*D2, with K1>10.

5. The method according to claim 4, wherein the second zones are arranged periodically in the semipolar nitride layer, on a second face opposite the first face, following a period, and the electric connection pads are arranged so that a majority of the second zones are respectively located opposite a single electric connection pad.

6. The method according to claim 4, wherein a distribution of the first zones is configured so that the first zones are removed by the step f) of forming the trenches.

7. The method according to claim 4, wherein the electric connection pads are separated from one another by electrically insulating regions, the first zones being arranged opposite the electrically insulating regions.

8. The method according to claim 4, wherein the electric connection pads are distributed periodically following a period P1.

9. The method according to claim 8, wherein the second zones are arranged periodically in the semipolar nitride layer, on a second face opposite the first face, following a period P2, and wherein P2=X*P1, with X ranging from 0.8 to 1.2.

10. The method according to claim 1, wherein the step e) of removing the crystallites comprises a step of chemical mechanical polishing (CMP).

11. The method according to claim 1, further including, following the step f) of forming the trenches, a step of deposition, on each microLED, of an electrode on and in contact with the first face of the semipolar nitride layer.

12. The method according to claim 1, wherein providing the assembly comprises providing the growth substrate and a step of epitaxial growth of the semipolar nitride structure from said facets featuring a crystalline orientation {111}.

13. The method according to claim 12, wherein the growth substrate comprises a barrier layer whereon the crystalline layer rests while being directly in contact therewith, the barrier layer being configured to allow the epitaxial growth of the semipolar nitride layer from the crystalline layer without epitaxial growth from the barrier layer.

14. The method according to claim 12, wherein the crystalline layer is silicon-based or made of silicon and the facets are formed by or covered by a crystalline buffer layer, the crystalline buffer layer being made of AlN.

15. The method according to claim 12, wherein the step of epitaxial growth comprises:
   a) a first epitaxial growth of a material based on aluminium nitride (AlN) from the facets having a crystalline orientation {111}; and
   b) then at least a second epitaxial growth of a material based on gallium nitride (GaN) from the material based on aluminium nitride (AlN).

16. The method according to claim 5, wherein a distribution of the first zones is configured so that the first zones are removed by the step f) of forming the trenches.

17. The method according to claim 6, wherein the electric connection pads are separated from one another by electrically insulating regions, the first zones being arranged opposite the electrically insulating regions.

* * * * *